United States Patent
Goth et al.

(10) Patent No.: US 9,313,930 B2
(45) Date of Patent: Apr. 12, 2016

(54) MULTI-LEVEL REDUNDANT COOLING SYSTEM FOR CONTINUOUS COOLING OF AN ELECTRONIC SYSTEM(S)

(71) Applicant: INTERNATIONAL BUSINESS MACHINES CORPORATION, Armonk, NY (US)

(72) Inventors: Gary F. Goth, Pleasant Valley, NY (US); Francis R. Krug, Jr., Highland, NY (US); Robert K. Mullady, Poughkeepsie, NY (US); Kevin P. Low, Poughkeepsie, NY (US); Allan C. Vandeventer, Poughkeepsie, NY (US); Randy J. Zoodsma, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 503 days.

(21) Appl. No.: 13/745,939

(22) Filed: Jan. 21, 2013

(65) Prior Publication Data

US 2014/0202678 A1    Jul. 24, 2014

(51) Int. Cl.
*H05K 7/20* (2006.01)
*F28F 27/02* (2006.01)
*G06F 1/20* (2006.01)

(52) U.S. Cl.
CPC ............ *H05K 7/20836* (2013.01); *F28F 27/02* (2013.01); *H05K 7/2079* (2013.01); *H05K 7/20718* (2013.01); *H05K 7/20763* (2013.01); *H05K 7/20772* (2013.01); *G06F 1/206* (2013.01)

(58) Field of Classification Search
CPC ....... G06F 1/20; G06F 1/206; H05K 7/20709; H05K 7/20836
USPC .......................................... 62/259.2; 361/688
See application file for complete search history.

(56) References Cited

U.S. PATENT DOCUMENTS 3,807,493 A    4/1974  Stewart
5,168,921 A    12/1992 Meyer
(Continued)

FOREIGN PATENT DOCUMENTS

CN    201222836 Y    4/2009
DE    19845821 B4    4/2000
(Continued)

OTHER PUBLICATIONS

Simons et al., "A Survey of Vapor Phase Cooling Systems", EDN Magazine, vol. 14, No. 1, pp. 53-56 (Jan. 1969).
(Continued)

*Primary Examiner* — Jonathan Bradford
(74) *Attorney, Agent, or Firm* — Margaret A. McNamara, Esq.; Kevin P. Radigan, Esq.; Heslin Rothenberg Farley & Mesiti P.C.

(57) ABSTRACT

A cooling system is provided to remove heat generated by one or more electronic systems. The cooling system includes a coolant-based cooling apparatus, redundant pumping units, redundant backup blowers, and multiple separate controllers. The cooling apparatus includes one or more heat exchange assemblies discharging heat from coolant of the cooling apparatus, and the redundant pumping units, which are coupled in parallel fluid communication, separately facilitate pumping of the coolant. The redundant backup blowers are disposed to provide, when activated, backup airflow across the electronic system(s). The multiple controllers control operation of the redundant pumping units and redundant backup blowers based, at least in part, on one or more sensed parameters. The redundant backup blowers are activated responsive to the sensed parameter(s) exceeding a set threshold to provide backup cooling to the electronic system(s) in the event of degraded performance of the cooling apparatus or the redundant pumping units.

19 Claims, 26 Drawing Sheets

(56) References Cited

U.S. PATENT DOCUMENTS

| | | | |
|---|---|---|---|
| 5,202,837 A | 4/1993 | Coe et al. | |
| 5,253,484 A | 10/1993 | Corman et al. | |
| 5,414,591 A | 5/1995 | Kumura et al. | |
| 5,596,507 A | 1/1997 | Jones et al. | |
| 5,794,454 A | 8/1998 | Harris et al. | |
| 6,006,168 A | 12/1999 | Schumann et al. | |
| 6,011,371 A | 1/2000 | Van Brocklin et al. | |
| 6,101,459 A * | 8/2000 | Tavallaei | G06F 1/206 702/130 |
| 6,263,959 B1 | 7/2001 | Ikeda et al. | |
| 6,400,045 B1 | 6/2002 | Hosokawa et al. | |
| 6,411,512 B1 | 6/2002 | Mankaruse et al. | |
| 6,434,000 B1 | 8/2002 | Pandolfi | |
| 6,446,026 B1 | 9/2002 | Dean et al. | |
| 6,462,949 B1 | 10/2002 | Parish et al. | |
| 6,480,014 B1 | 11/2002 | Li et al. | |
| 6,557,354 B1 | 5/2003 | Chu et al. | |
| 6,698,218 B2 | 3/2004 | Goth et al. | |
| 6,775,137 B2 | 8/2004 | Chu et al. | |
| 6,801,004 B2 * | 10/2004 | Frankel | H02P 6/08 318/268 |
| 6,826,456 B1 * | 11/2004 | Irving | G06F 1/20 361/695 |
| 6,924,981 B2 | 8/2005 | Chu et al. | |
| 6,931,306 B2 * | 8/2005 | Frankel | G05D 23/1917 700/300 |
| 6,934,118 B2 | 8/2005 | Hidaka et al. | |
| 6,968,709 B2 | 11/2005 | Goth et al. | |
| 7,002,799 B2 | 2/2006 | Malone et al. | |
| 7,042,726 B2 | 5/2006 | Cader et al. | |
| 7,103,509 B2 | 9/2006 | Shah et al. | |
| 7,151,668 B1 | 12/2006 | Stathakis | |
| 7,218,129 B2 | 5/2007 | Beaman et al. | |
| 7,233,501 B1 | 6/2007 | Ingalz | |
| 7,273,090 B2 | 9/2007 | Crocker et al. | |
| 7,286,355 B2 | 10/2007 | Cheon | |
| 7,310,737 B2 | 12/2007 | Patel et al. | |
| 7,316,606 B2 * | 1/2008 | Shipley | H05K 7/20572 312/236 |
| 7,346,468 B2 | 3/2008 | Bashor et al. | |
| 7,365,973 B2 | 4/2008 | Rasmussen et al. | |
| 7,365,985 B1 | 4/2008 | Ni | |
| 7,385,810 B2 | 6/2008 | Chu et al. | |
| 7,388,749 B1 | 6/2008 | Feroli et al. | |
| 7,395,851 B2 | 7/2008 | Lee et al. | |
| 7,436,663 B2 | 10/2008 | Matsushima et al. | |
| 7,440,278 B2 | 10/2008 | Cheng | |
| 7,443,672 B2 | 10/2008 | Peng et al. | |
| 7,450,385 B1 | 11/2008 | Campbell et al. | |
| 7,469,551 B2 | 12/2008 | Tilton et al. | |
| 7,573,714 B2 | 8/2009 | Ali | |
| 7,583,043 B2 | 9/2009 | Chung et al. | |
| 7,595,550 B2 | 9/2009 | Cady et al. | |
| 7,626,820 B1 | 12/2009 | Konshak et al. | |
| 7,660,109 B2 | 2/2010 | Iyengar et al. | |
| 7,684,196 B2 | 3/2010 | Eckberg et al. | |
| 7,701,714 B2 | 4/2010 | Shabany | |
| 7,703,291 B2 | 4/2010 | Bushnik et al. | |
| 7,721,125 B2 | 5/2010 | Fung | |
| 7,746,634 B2 | 6/2010 | Hom et al. | |
| 7,791,882 B2 | 9/2010 | Chu et al. | |
| 7,796,393 B2 | 9/2010 | Lengen et al. | |
| 7,796,399 B2 | 9/2010 | Clayton et al. | |
| 7,817,412 B2 | 10/2010 | Sullivan | |
| 7,826,216 B2 | 11/2010 | Moss | |
| 7,830,657 B2 | 11/2010 | Chu et al. | |
| 7,862,410 B2 * | 1/2011 | McMahan | H05K 7/20736 454/184 |
| 2,907,406 A1 | 3/2011 | Campbell et al. | |
| 8,027,162 B2 | 9/2011 | Campbell et al. | |
| 8,051,897 B2 | 11/2011 | Campbell et al. | |
| 8,290,629 B1 * | 10/2012 | Mateski | H05K 7/20836 137/2 |
| 2004/0060305 A1 | 4/2004 | Singh et al. | |
| 2004/0130868 A1 * | 7/2004 | Schwartz et al. | 361/687 |
| 2004/0221604 A1 | 11/2004 | Ota et al. | |
| 2005/0109049 A1 | 5/2005 | Chan | |
| 2006/0146497 A1 | 7/2006 | Gauche et al. | |
| 2006/0176186 A1 | 8/2006 | Larson et al. | |
| 2006/0224254 A1 | 10/2006 | Rumi et al. | |
| 2006/0225433 A1 | 10/2006 | Jammu et al. | |
| 2006/0250772 A1 | 11/2006 | Salmonson et al. | |
| 2007/0044493 A1 | 3/2007 | Kearney et al. | |
| 2007/0211430 A1 | 9/2007 | Bechtolsheim | |
| 2008/0112075 A1 | 5/2008 | Farquhar et al. | |
| 2008/0239564 A1 | 10/2008 | Farquhar et al. | |
| 2008/0245083 A1 | 10/2008 | Tutunoglu et al. | |
| 2008/0259566 A1 | 10/2008 | Fried | |
| 2008/0310105 A1 | 12/2008 | Cheng | |
| 2008/0313492 A1 | 12/2008 | Hansen | |
| 2009/0002951 A1 | 1/2009 | Legen et al. | |
| 2009/0080151 A1 | 3/2009 | Kalms et al. | |
| 2009/0120607 A1 | 5/2009 | Cheon et al. | |
| 2009/0177334 A1 | 7/2009 | Artman et al. | |
| 2009/0219687 A1 | 9/2009 | Lin | |
| 2009/0259347 A1 | 10/2009 | Gross et al. | |
| 2009/0268404 A1 | 10/2009 | Chu et al. | |
| 2009/0277616 A1 | 11/2009 | Cipolla et al. | |
| 2009/0284924 A1 | 11/2009 | Konshak et al. | |
| 2010/0025010 A1 | 2/2010 | Cipolla et al. | |
| 2010/0027220 A1 | 2/2010 | Hughes et al. | |
| 2010/0085712 A1 | 4/2010 | Hrehor et al. | |
| 2010/0094593 A1 | 4/2010 | Reddy et al. | |
| 2010/0126696 A1 | 5/2010 | Novotny et al. | |
| 2010/0142147 A1 | 6/2010 | Chang et al. | |
| 2010/0252234 A1 | 10/2010 | Cambell et al. | |
| 2010/0263855 A1 * | 10/2010 | Arimilli et al. | 165/288 |
| 2010/0274522 A1 | 10/2010 | Sri-Jayantha et al. | |
| 2010/0306598 A1 | 12/2010 | Ackaret et al. | |
| 2010/0313590 A1 | 12/2010 | Campbell et al. | |
| 2010/0318826 A1 | 12/2010 | Hansen et al. | |
| 2011/0051372 A1 | 3/2011 | Barringer et al. | |
| 2011/0057803 A1 | 3/2011 | Yamaoka et al. | |
| 2011/0060470 A1 | 3/2011 | Campbell et al. | |
| 2011/0069454 A1 | 3/2011 | Campbell et al. | |
| 2011/0112694 A1 | 5/2011 | Bash et al. | |
| 2011/0197612 A1 | 8/2011 | Campbell et al. | |
| 2011/0224947 A1 | 9/2011 | Kriss | |
| 2011/0261526 A1 | 10/2011 | Atkins et al. | |
| 2011/0277967 A1 | 11/2011 | Fried et al. | |
| 2011/0315343 A1 | 12/2011 | Campbell et al. | |
| 2011/0315344 A1 | 12/2011 | Campbell et al. | |
| 2011/0315353 A1 | 12/2011 | Campbell et al. | |
| 2011/0315355 A1 | 12/2011 | Campbell et al. | |
| 2011/0317367 A1 | 12/2011 | Campbell et al. | |
| 2012/0120603 A1 | 5/2012 | Campbell et al. | |
| 2012/0279233 A1 | 11/2012 | Chainer et al. | |
| 2012/0300398 A1 | 11/2012 | Eckberg et al. | |
| 2013/0166093 A1 * | 6/2013 | Kim et al. | 700/299 |
| 2015/0075764 A1 | 3/2015 | Goth et al. | |

FOREIGN PATENT DOCUMENTS

| | | |
|---|---|---|
| GB | 2436669 B | 5/2011 |
| JP | 01077199 A | 3/1989 |
| JP | 2010040886 A | 2/2010 |
| TW | 323643 U | 12/2007 |
| TW | 200937175 A | 9/2009 |
| WO | WO 97/047167 A1 | 12/1997 |
| WO | WO 02/037918 A1 | 5/2002 |
| WO | WO 2007140110 A2 | 12/2007 |
| WO | WO 2010075358 A1 | 7/2010 |

OTHER PUBLICATIONS

Crispell et al., "Use of Liquid Metal to Promote Boiling on Immersed Integrated Circuit Chips", IBM Technical Disclosure Bulletin, IPCOM000058250D, TDB 09-88, pp. 365-366 (Sep. 1, 1988).

Delia et al., "System Cooling Design for the Water-Cooled IBM Enterprise System/900 Processors", IBM Journal of Research and Development, vol. 36, No. 4, pp. 791-803 (Jul. 1992).

Mudawar, et al., "Immersion-Cooled Standard Electronic Clamshell Module: A Building Block for Future High-Flux Avionic Systems", Journal of Electronic Packaging, vol. 116, pp. 116-125 (Jun. 1994).

(56) References Cited

OTHER PUBLICATIONS

Gaunt et al., "Two Speed Control in Multi-Fan Cooling Systems", IBM Technical Disclosure Bulletin, IPCOM000112835D, vol. 37, No. 6B, pp. 103-104 (Jun. 1, 1994).
Hall et al., "Redundant Cooling for a High Availability CPU Enclosure", IBM Technical Disclosure Bulletin, IPCOM000113478D, vol. 37, No. 8, pp. 557-560 (Aug. 1, 1994).
Nelson et al. "Thermal Performance of an Integral Immersion Cooled Multichip Module Package", IEEE on Components, Packages, and Manufacturing Technology—Part A, vol. 17, No. 3, pp. 405-412 (Sep. 1994).
Christensen et al., "Redundant Cooling of Computers", IBM Technical Disclosure Bulletin, IPCOM000123896D, vol. 42, No. 422, Article #422126 (Jun. 1, 1999).
Arent, "Liquid Coolant Distribution Unit with Convertible Air or Water Cooling", IBM Technical Disclosure Bulletin, IPCOM000044828D (Feb. 6, 2005).
Morgan, "IBM Hints at Triple Redundancy in Power6", (http://www.itjungle.com/breaking/bn032906-story-1.html) (Mar. 29, 2006).
Ellsworth, Jr. et al., "The Evolution of Water Cooling for IBM Larger Server Systems: Back to the Future", IEEE, Piscataway, NJ, 2008 11th Intersociety Conference on Thermal and Thermomechanical Phenomena in Electronic Systems (ITHERM '08), pp. 266-274 (May 2008).
IBM Technical Disclosure, "Highly-Efficient Copper Rail Design for Optimized Cooling of DRAM Modules", IPCOM000184053D (Jun. 9, 2009).
Geisler et al., "Passive Immersion Cooling of 3-D Stacked Dies", IEEE Transactions on Components and Packaging Technologies, vol. 32, No. 3, pp. 557-565 (Sep. 2009).
Anonymous, "Cross-Over Airflow Plenum for Distributed Airflow During a Fan Failure Event", IBM Technical Disclosure Bulletin, IPCOM000196500D, 6 pages (Jun. 3, 2010).
Forrest et al., "Pressure Effects on the Pool of Boiling of the Fluorinated Ketone", Thermal and Thermomechanical Phenomena in Electronic Systems (ITherm), pp. 1-9 (2010). (No further date information is available).
Rubenstein et al., "Hypbrid Cooled Data Center Using Above Ambient Liquid Cooling", IEEE (2010) (No further date information is available).
Goth et al., "Hybrid Cooling with Cycle Steering in the IBM eServer z990", IBM Journal of Research and Development, vol. 48, Issue 3.4, pp. 7=409-423 (Abstract Only) (May 2004).
Campbell et al., "Multi-Fluid, Two-Phase Cooling of Electronic Component(s)", U.S. Appl. No. 13/281,945, filed Oct. 26, 2011.
Chainer et al., "Directly Connected Heat Exchanger Tube Section and Coolant-Cooled Structure", U.S. Appl. No. 13/283,933, filed Oct. 28, 2011.
Campbell et al., "Multi-Rack Assembly With Shared Cooling Unit", U.S. Appl. No. 13/285,116, filed Oct. 31, 2011.
Chainer et al., "Dynamically Limiting Energy Consumed by Cooling Apparatus", U.S. Appl. No. 13/305,967, filed Nov. 29, 2011.
Goth et al., Office Action for U.S. Appl. No. 14/551,489, filed Nov. 24, 2014 (U.S. Patent Publication No. 2015/0075764 A1), dated Jun. 5, 2015 (13 pages).
Goth et al., Office Action for U.S Serial No. 14/551,489, filed Nov. 24, 2014 (U.S. Patent Publication No. 2015/0075764 Al), dated Sep. 16, 2015 (13 pages).

* cited by examiner

MULTI-LEVEL REDUNDANT COOLING SYSTEM FOR CONTINUOUS COOLING OF AN ELECTRONIC SYSTEM(S)

BACKGROUND

The power dissipation of integrated circuit chips, and the modules containing the chips, continues to increase in order to achieve increases in processor performance. This trend poses cooling challenges at the module, system, rack and data center levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Conventionally, the components have been cooled by air moving in parallel airflow paths, usually front-to-back, impelled by one or more air moving devices (e.g., fans or blowers). In some cases it has been possible to handle increased power dissipation within a single drawer or system by providing greater airflow, for example, through the use of more powerful air moving devices or by increasing the rotational speed (i.e., RPMs) of existing air moving devices. However, this approach is becoming problematic, particularly in the context of a computer center installation (i.e., data center).

The sensible heat load carried by the air exiting the rack(s) is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid coolant to a heat sink, whether air or other liquid.

BRIEF SUMMARY

The shortcomings of the prior art are overcome and additional advantages are provided through the provision, in one aspect, of a cooling system comprising a coolant-based cooling apparatus, redundant pumping units, redundant backup blowers, and multiple separate controllers. The coolant-based cooling apparatus is configured to assist in removal of heat generated by one or more electronic systems, and includes at least one heat exchange assembly to discharge heat from coolant of the coolant-based cooling apparatus. The redundant pumping units facilitate pumping of the coolant through the coolant-based cooling apparatus to assist in removal of heat generated by the electronic system(s), and discharge of the heat via the at least one heat exchange assembly. The redundant pumping units are coupled to the coolant-based cooling apparatus in parallel fluid communication to separately provide pumping of the coolant through the cooling apparatus. The redundant backup blowers are disposed to provide, when activated, a backup airflow across the one or more electronic systems to facilitate backup airflow cooling thereof. The multiple separate controllers control operation of the redundant pumping units and the redundant backup blowers based, at least in part, on one or more sensed parameters. At least one controller of the multiple separate controllers activate the redundant backup blowers responsive to the one or more sensed parameters exceeding a set threshold, and the redundant backup blowers provide, at least in part, backup airflow cooling to the one or more electronic systems in the event of a degraded performance of the coolant-based cooling apparatus or the redundant pumping units.

In another aspect, a cooled electronics assembly is provided which includes an electronics rack comprising one or more electronic systems, and a cooling system for cooling the electronic system(s). The cooling system includes a coolant-based coolant apparatus, redundant pumping units, redundant backup blowers, and multiple separate controllers. The coolant-based cooling apparatus is configured to assist in removal of heat generated by the one or more electronic systems, and includes at least one heat exchange assembly to discharge heat from coolant of the coolant-based cooling apparatus. The redundant pumping units facilitate pumping of the coolant through the coolant-based cooling apparatus to assist in removal of heat generated by the electronic system(s), and discharge of the heat via the at least one heat exchange assembly. The redundant pumping units are coupled to the coolant-based cooling apparatus in parallel fluid communication to separately provide pumping of the coolant through the cooling apparatus. The redundant backup blowers are disposed to provided, when activated, a backup airflow across the one or more electronic systems to facilitate backup airflow cooling thereof. The multiple separate controllers control operation of the redundant pumping units and the redundant backup blowers based, at least in part, on one or more sensed parameters. At least one controller of the multiple separate controllers activate the redundant backup blowers responsive to the one or more sensed parameters exceeding a set threshold, and the redundant backup blowers provide, at least in part, backup airflow cooling to the one or more electronic systems in the event of a degraded performance of the coolant-based cooling apparatus or the redundant pumping units.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
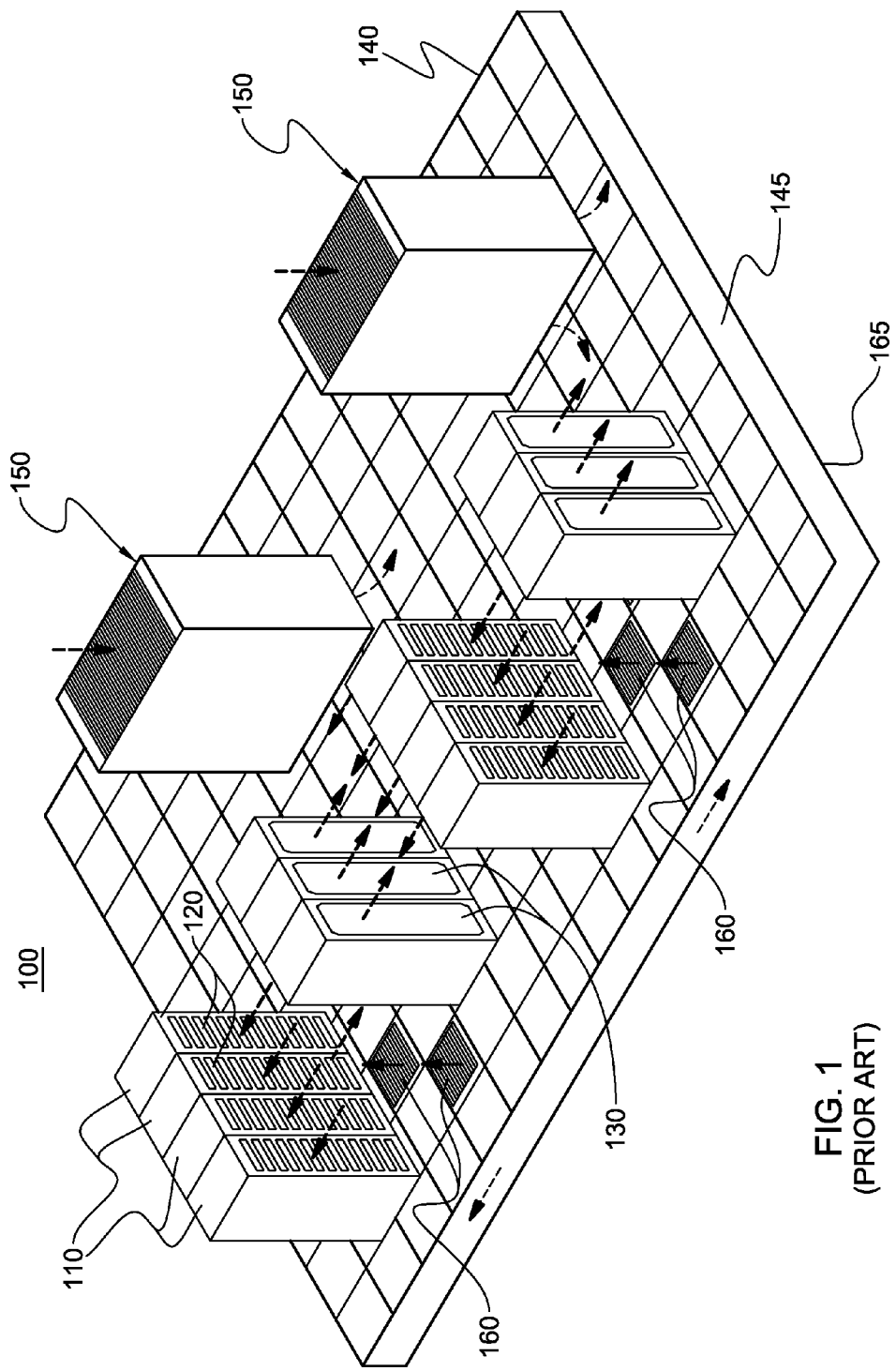
FIG. 1 depicts one embodiment of a conventional raised floor layout of an air-cooled data center.

As used herein, the terms "electronics rack", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, drawers, nodes, compartments, boards, etc., having one or more heat-generating electronic components disposed therein or thereon. An electronic system may be movable or fixed, for example, relative to an electronics rack, with rack-mounted electronic drawers of a rack unit and blades of a blade center system being two examples of electronic systems (or sub-systems) of an electronics rack to be cooled. In one embodiment, an electronic system may comprise multiple different types of electronic components, and may be, in one example, a server unit.

"Electronic component" refers to any heat generating electronic component of, for example, an electronic system requiring cooling. By way of example, an electronic component may comprise one or more integrated circuit dies and/or other electronic devices to be cooled, including one or more processor dies, memory dies or memory support dies. As a further example, an electronic component may comprise one or more bare dies or one or more packaged dies disposed on a common carrier. Further, unless otherwise specified herein, the terms "liquid-cooled cold plate" or "liquid-cooled structure" refer to any conventional thermally conductive, heat transfer structure having a plurality of channels or passageways formed therein for flowing of liquid-coolant therethrough.

As used herein, an "air-to-liquid heat exchanger", "liquid-to-air heat exchanger", or "coolant-to-air heat exchanger" means any heat exchange mechanism characterized as described herein, across which air passes and through which liquid coolant can circulate; and includes, one or more discrete heat exchangers, coupled either in series or in parallel. An air-to-liquid heat exchanger may comprise, for example, one or more coolant flow paths, formed of thermally conductive tubing (such as copper or other tubing) thermally coupled to a plurality of fins across which air passes. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other coolant, or refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
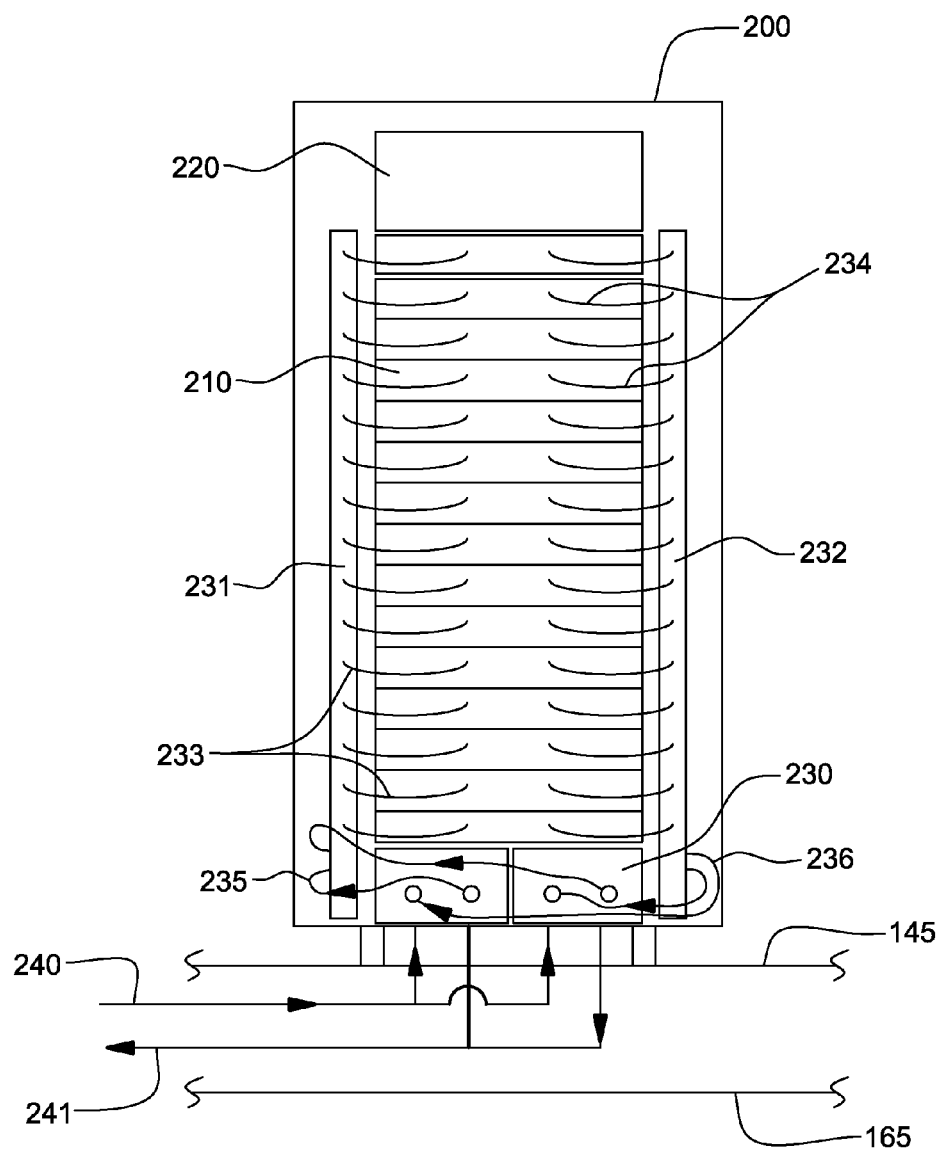
FIG. 2 is a front elevational view of one embodiment of a liquid-cooled electronics rack comprising multiple electronic systems being cooled via a cooling system, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus includes a system coolant supply manifold 231, a system coolant return manifold 232, and manifold-to-node fluid connect hoses 233 coupling system coolant supply manifold 231 to electronic systems 210 (for example, to cold plates disposed within the systems) and node-to-manifold fluid connect hoses 234 coupling the individual electronic subsystems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
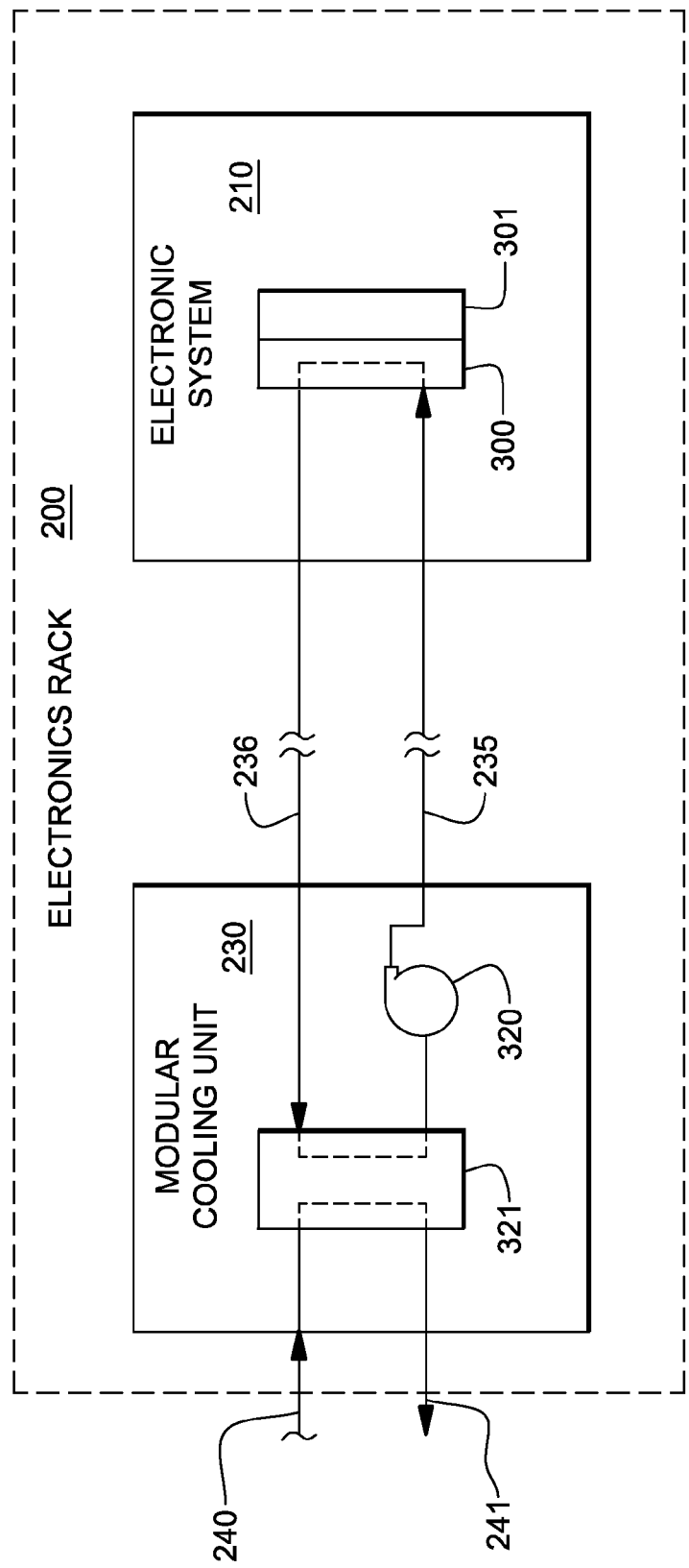
FIG. 3 is a schematic of an electronic system of an electronics rack and one approach to liquid-cooling of one or more electronic components within the electronic system, wherein the electronic component(s) is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic subsystems. Furthermore, the system coolant is physically separate from the less controlled facility coolant in lines 240, 241, to which heat is ultimately transferred in this example.

Figure 4:
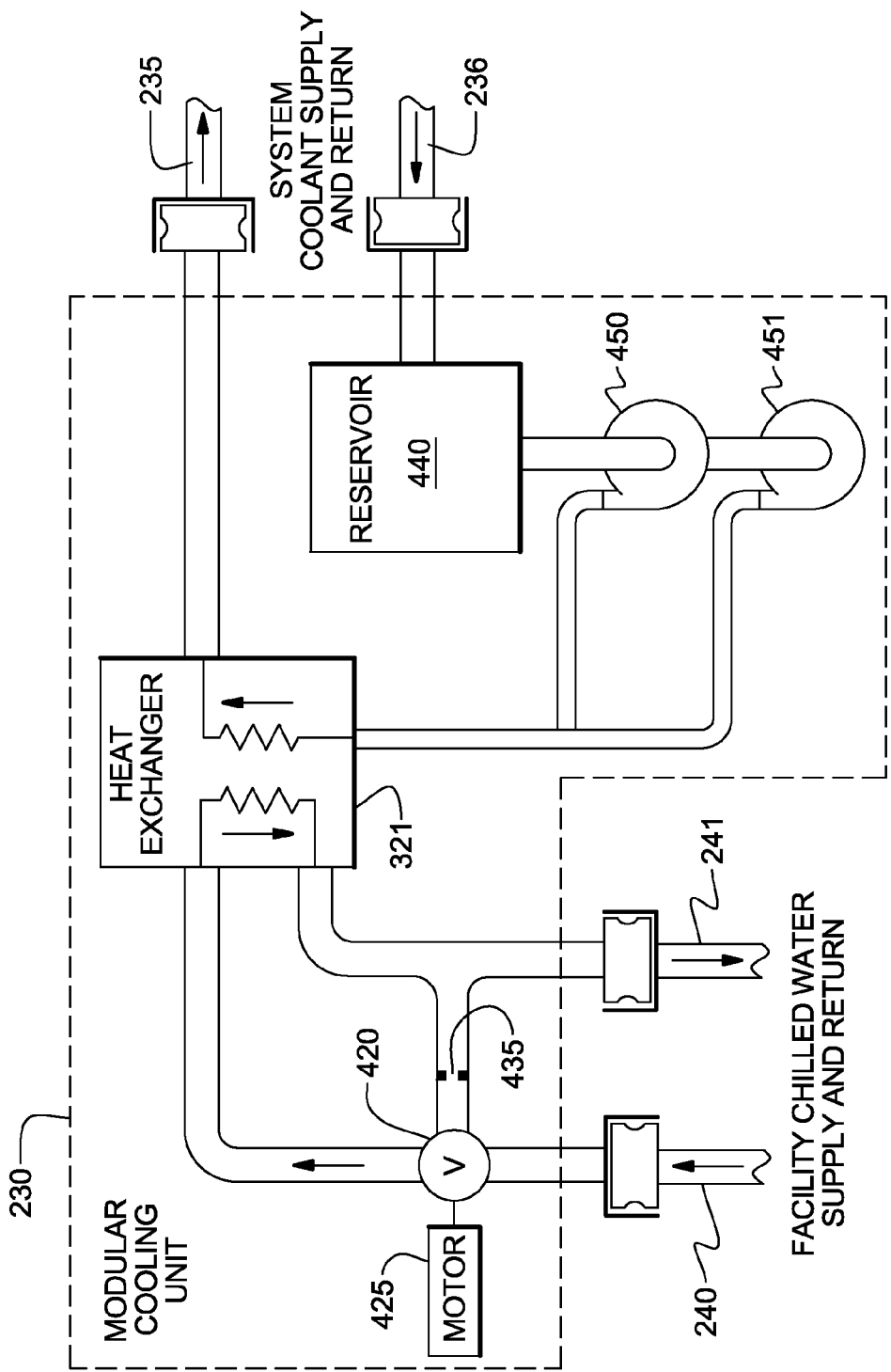
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
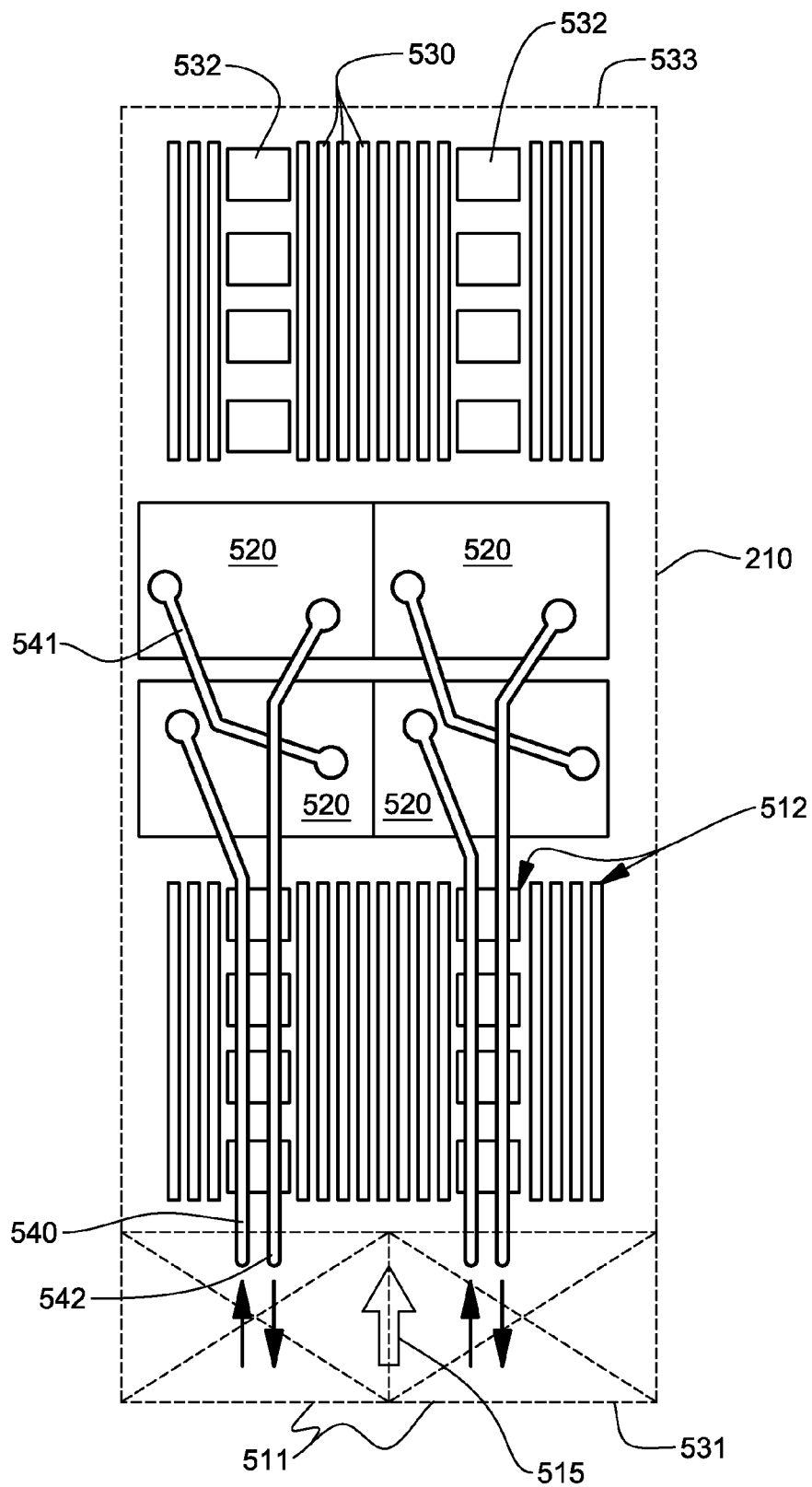
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics subsystem.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6A:
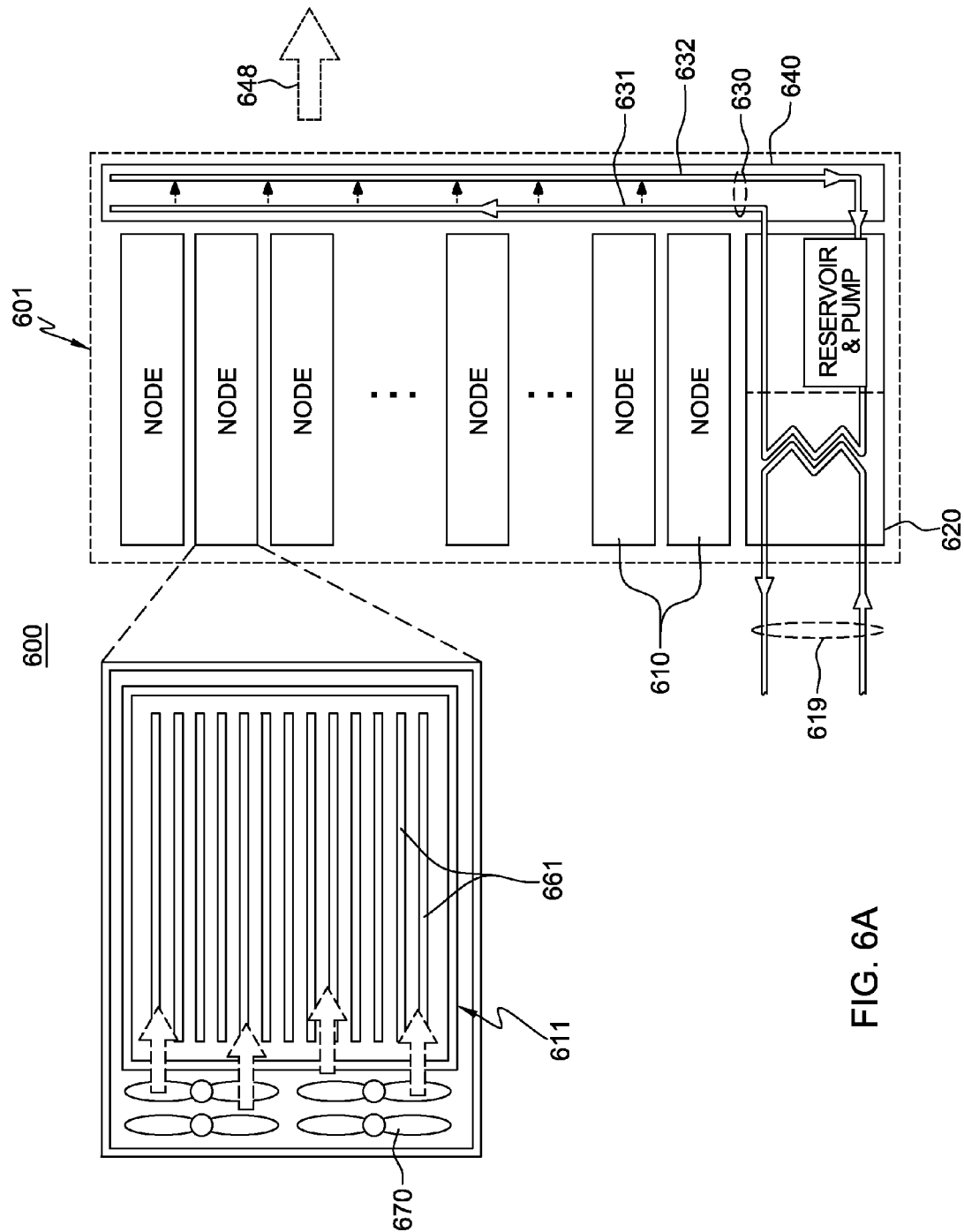
FIG. 6A is a schematic of one embodiment of a partially air-cooled electronics rack with liquid-cooling of one or more liquid-to-air heat exchangers, in accordance with one or more aspects of the present invention.

FIG. 6A is a schematic of another embodiment of an electronic system 600 comprising a liquid-cooled electronics rack 601 with a plurality of air-cooled electronic systems 610 disposed, in the illustrated embodiment, horizontally, so as to be stacked within the rack. By way of example, each electronic system 610 may be a server unit of a rack-mounted plurality of server units. In addition, each electronic system may include multiple electronic components to be cooled, which in one embodiment, comprise multiple different types of electronic components having different heights and/or shapes within the electronic system. As illustrated, one or more electronic systems 610 comprise an air-cooled heat sink 611 with a plurality of thermally conductive fins 661 projecting from the heat sink, through which airflow through the electronics rack passes. One or more air-moving devices 670 are provided within electronic system 610 to facilitate airflow from, for example, an air inlet side to an air outlet side of the liquid-cooled electronics rack 601. As explained below, the electronics rack is liquid-cooled via the inclusion of an air-to-liquid heat exchanger at the air outlet side of the rack.

The cooling apparatus is shown to include one or more modular cooling units (MCUs) 620 disposed, by way of example, in a lower portion of electronics rack 601. Each modular cooling unit 620 may be similar to the modular cooling unit depicted in FIG. 4, and described above (or may comprise multiple modular pumping units, as described below with reference to FIGS. 9-12). The modular cooling unit 620 includes, for example, a liquid-to-liquid heat exchanger for extracting heat from coolant flowing through a system coolant loop 630 of the cooling apparatus and dissipating heat within a facility coolant loop 619, comprising a facility coolant supply line and a facility coolant return line. As one example, the facility coolant supply and return lines couple modular cooling unit 620 to a data center facility cooling supply and return (not shown). Modular cooling unit 620 further includes an appropriately-sized reservoir, pump, and optional filter, for moving liquid-coolant under pressure through system coolant loop 630. In one embodiment, system coolant loop 630 includes a coolant supply manifold 631 and a coolant return manifold 632, which facilitate flow of system coolant through, for example, an air-to-liquid heat exchanger 640 mounted to an air outlet side (or an air inlet side) of electronics rack 601. Air-to-liquid heat exchanger 640 extracts heat from airflow 648 egressing from liquid-cooled electronics rack 601. By way of example, one embodiment of an air-to-liquid heat exchanger 640 is described further below with reference to FIG. 6B.

Figure 6B:
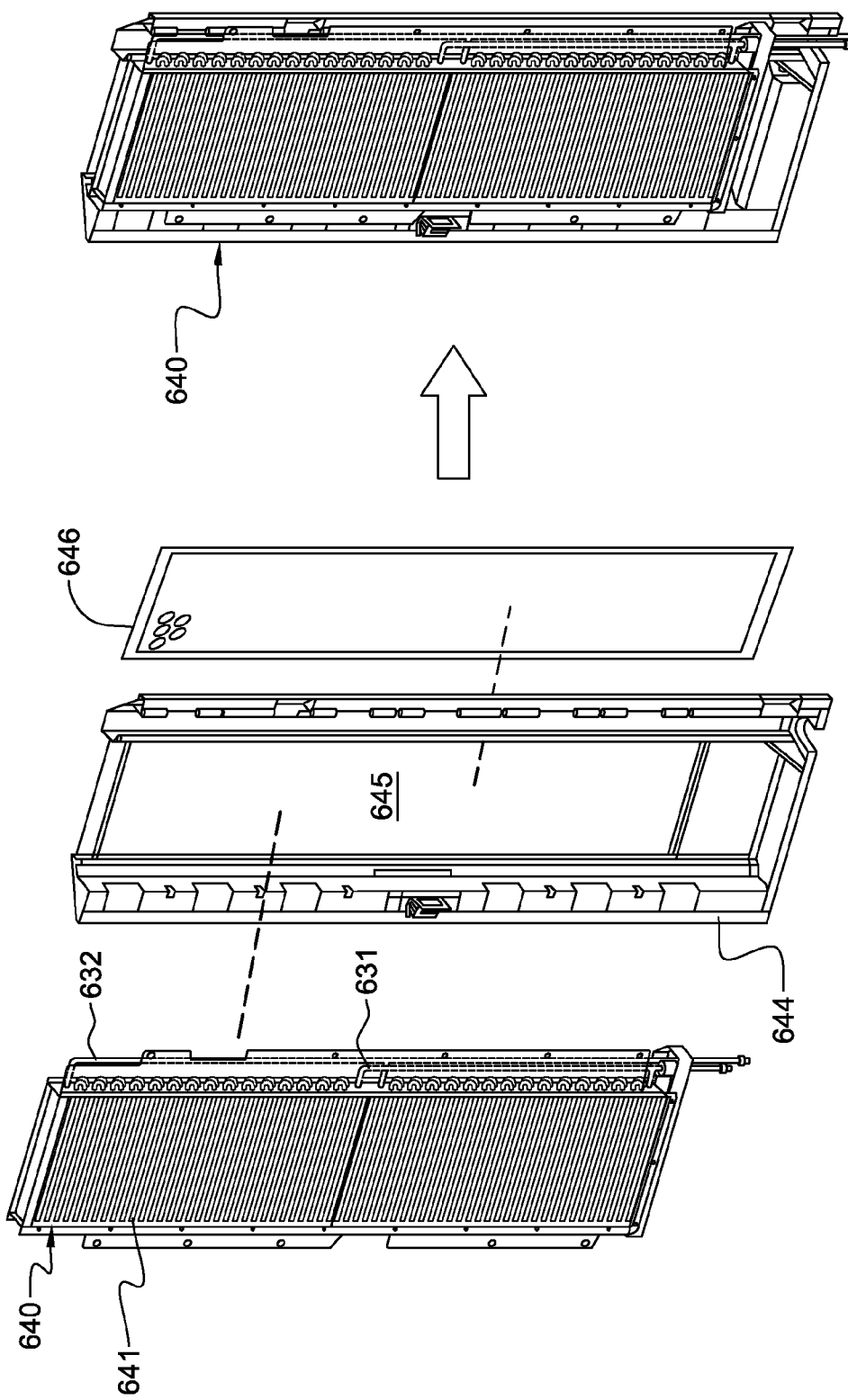
FIG. 6B is a partially exploded view of one embodiment of a liquid-to-air heat exchanger mounted in a rack door, which includes a heat exchanger coil and inlet and outlet plenums of a heat exchange system for use with an electronics rack such as depicted in FIG. 6A, in accordance with one or more aspects of the present invention.

FIG. 6B depicts additional details of one embodiment of an air-to-liquid heat exchanger mounted in a rack door. As shown at the left portion of the figure, heat exchanger 640 includes one or more tube sections 641, which in one embodiment, may have a plurality of fins projecting therefrom. Depending upon the implementation, tube sections 641 may comprise a single, serpentine channel, or a plurality of discrete heat exchange tube sections coupled together via inlet and outlet plenums 631, 632 disposed at the edge of the rack door configured to hingedly mount to the electronics rack. As shown, the one or more heat exchange tube sections are sized to substantially cover the entire opening 645 in the frame 644 of the door.

In the depicted embodiment, the heat exchange tube sections are fed coolant by coolant inlet plenum 631 and exhaust coolant via coolant outlet plenum 632. Flexible hoses (not shown) may be employed for connecting to hard plumbing disposed near the electronics rack. These hoses would be brought into air-to-liquid heat exchanger 640 adjacent to the hinge axis of the door.

FIG. 6B also illustrates one embodiment of an optional perforated planar surface 646 is illustrated. First and second such perforated planar surfaces 646 could be provided for covering first and second main sides of the heat exchanger. In one embodiment, the perforated planar surfaces comprise metal plates having appropriate air flow openings to allow inlet-to-outlet airflow through the electronics rack to readily pass through the heat exchanger. One embodiment of airflow openings in the perforated planar surfaces is depicted in FIG. 6B. In this embodiment, the perforated planar surface has a plurality of openings disposed throughout the plate. As one example, these openings may comprise hexagon-shaped openings which maximize air flow through the perforated surfaces, while still providing the desired isolation of the heat exchanger.

Each heat exchange tube section may comprise at least one of a continuous tube or multiple tubes connected together to form one continuous serpentine cooling channel. In the embodiment shown, each heat exchange tube section is a continuous tube having a first diameter, and each plenum 631, 632, is a tube having a second diameter, wherein the second diameter is greater than the first diameter. The first and second diameters are chosen to ensure adequate supply of coolant flow through the multiple tube sections. In one embodiment, each heat exchange tube section may align to a respective electronics subsystem of the electronics rack.

Although not shown in FIG. 6B, the heat exchange tube sections further include a plurality of fins extending from tube(s) 641 to facilitate heat transfer, for example, from air exhausted out the back of the electronics rack to coolant flowing through the serpentine cooling channels of the individual heat exchange tube sections. In one embodiment, the plurality of fins comprise aluminum fins extending from the individual tubes, which could be constructed of copper tubing. Further, in one implementation, the fins are brazed to the tubing.

Figure 7:
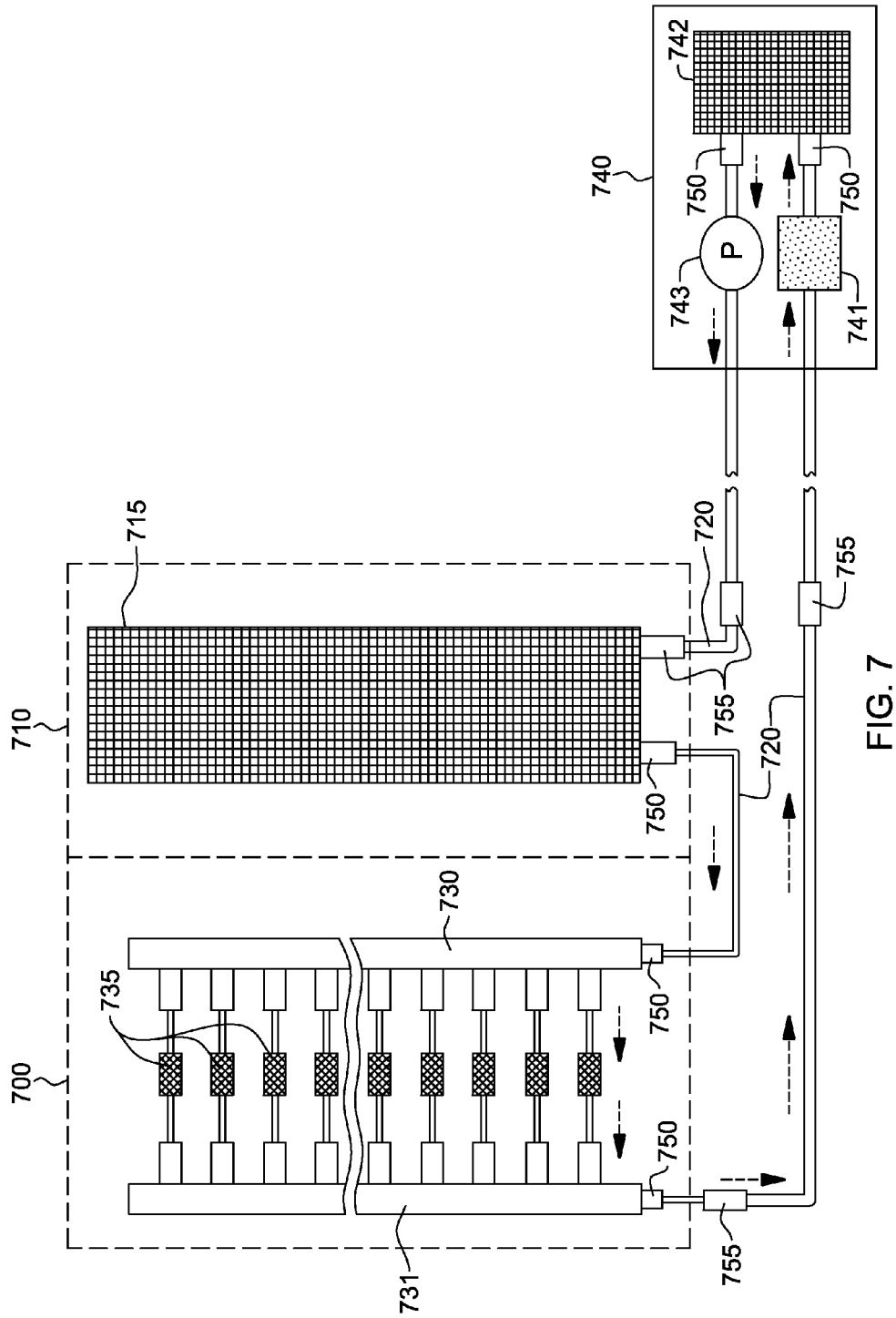
FIG. 7 is a schematic diagram of an alternate embodiment of a cooling system and coolant-cooled electronic system, which may employ modular pumping units (MPUs), in accordance with one or more aspects of the present invention.

FIG. 7 illustrates another embodiment of a coolant-cooled electronics rack and cooling system therefore, in accordance with one or more aspects of the present invention. In this embodiment, the electronics rack 700 has a side car structure 710 associated therewith or attached thereto, which includes an air-to-coolant heat exchanger 715 through which air circulates from an air outlet side of electronics rack 700 towards an air inlet side of electronics rack 700. In this example, the cooling system comprises an economizer-based, warm-liquid coolant loop 720, which comprises multiple coolant tubes (or lines) connecting, in the example depicted, air-to-coolant heat exchanger 715 in series fluid communication with a coolant supply manifold 730 associated with electronics rack 700, and connecting in series fluid communication, a coolant return manifold 731 associated with electronics rack 700, a cooling unit 740 of the cooling system, and air-to-coolant heat exchanger 715.

As illustrated, coolant flowing through warm-liquid coolant loop 720, after circulating through air-to-coolant heat exchanger 715, flows via coolant supply plenum 730 to one or more electronic systems of electronics rack 700, and in particular, one or more cold plates and/or cold rails 735 associated with the electronic systems, before returning via coolant return manifold 731 to warm-liquid coolant loop 720, and subsequently to a cooling unit 740 disposed (for example) outdoors from the data center. In the embodiment illustrated, cooling unit 740 includes a filter 741 for filtering the circulating coolant, a condenser (or air-to-coolant heat exchanger) 742 for removing heat from the coolant, and a pump 743 for returning the coolant through warm-liquid coolant loop 720 to air-to-coolant heat exchanger 715, and subsequently to the coolant-cooled electronics rack 700. By way of example, hose barb fittings 750 and quick disconnect couplings 755 may be employed to facilitate assembly or disassembly of warm-liquid coolant loop 720.

In one example of the warm coolant-cooling approach of FIG. 7, ambient temperature might be 30° C., and coolant temperature 35° C. leaving the air-to-coolant heat exchanger 742 of the cooling unit. The cooled electronic system depicted thus facilitates a chiller-less data center. Advantageously, such a coolant-cooling solution provides highly energy efficient cooling of the electronic system(s) of the electronics rack, using coolant (e.g., water), that is cooled via circulation through the air-to-coolant heat exchanger located outdoors (i.e., a dry cooler) with external ambient air being pumped through the dry cooler. Note that this warm coolant-cooling approach of FIG. 7 is presented by way of example only. In alternate approaches, cold coolant-cooling could be substituted for the cooling unit 740 depicted in FIG. 7. Such cold coolant-cooling might employ building chilled facility coolant to cool the coolant flowing through the coolant-cooled electronics rack, and associated air-to-coolant heat exchanger (if present), in a manner such as described above.

Figure 8:
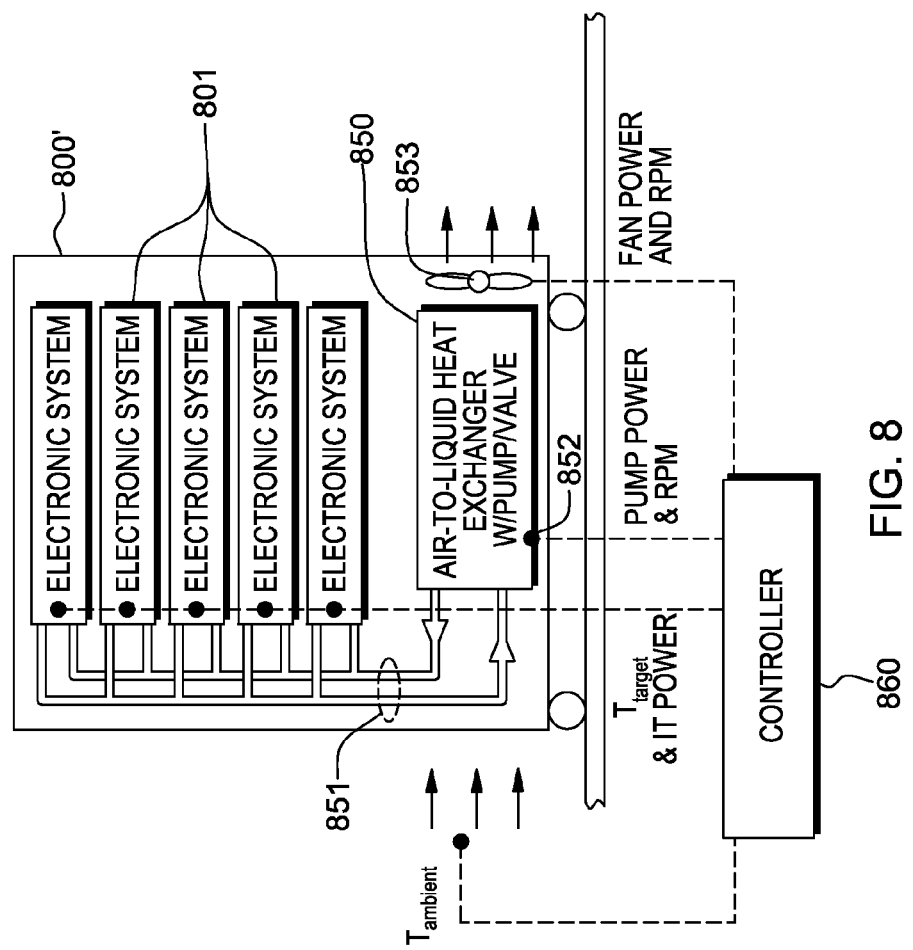
FIG. 8 is a schematic diagram of a further embodiment of a cooling system cooling one or more electronic systems, which may employ modular pumping units (MPUs), in accordance with one or more aspects of the present invention.

FIG. 8 depicts another alternate embodiment of a cooled electronic system which comprises an electronics rack 800 with multiple electronic systems (or subsystems) 801, such as the coolant-cooled electronic systems described above. An air-to-liquid heat exchanger 850 provides cooled coolant via a coolant loop 851 to the electronic systems 801 within electronics rack 800. A controller 860 provides energy efficient cooling control of the cooling system and electronic system and, in one embodiment, couples to a pump 852 of air-to-liquid heat exchange unit 850 to control a flow rate of coolant through coolant loop 851, as well as to an air-moving device, such as a fan 853 associated with the air-to-liquid heat exchange unit 850. In addition to sensing pump and fan power or speed (RPMs), controller 860 is coupled to sense a targeted temperature ($T_{target}$) at, for example, the coolant inputs to the individual electronic systems 801, as well as electronic system power being consumed (IT power), and the ambient airflow temperature ($T_{ambient}$).

FIG. 8 depicts an example of a cooled electronic system which comprises a controller (or control system), which may implement reduced power consumption cooling control, in accordance with aspects of the present invention. Note that as used herein, a controller or control system may comprise, by way of example, a computer or a programmable logic controller. The control system may include, for instance, a processor (e.g., a central processing unit), a memory (e.g., main memory), and multiple input/output (I/O) connections, interfaces, devices, etc., coupled together via one or more buses and/or other connections. In one application, the controller or control system couples to a plurality of sensors, such as temperature, pressure, or position sensors, as well as (optionally) to one or more actuators for controlling, for instance, coolant pump speed, fan speed, or position of one or more recirculation valves. Note that the input/output sense and control arrangements may be integrated within the controller or control system, or they may be external I/O modules or devices coupled to the controller which facilitate the desired sensing and actuation functions.

Typically, the heat exchanger or heat exchange assemblies employed by cooling systems such as described above in connection with FIGS. 2-8 comprise conventional, non-modular, plumbing systems, which can introduce potential leak sites, especially at locations where field-servicing requires coolant loops to be broken. Typically, when a coolant leak occurs in an IT rack or electronic system utilizing liquid-cooling to move the heat to a heat sink, the electronic system needs to be shut down for repair of the coolant leak. For example, the above-described solutions to providing liquid-cooling to an IT rack are typically made up of single, non-redundant components, which require shutting down of the electronic system or rack to service and/or replace a failed or failing component. Disclosed hereinbelow are enhanced cooling systems which address this issue, and allow for servicing of the cooling system without shutting down the respective electronic system(s) or rack.

Generally stated, disclosed herein is an apparatus which comprises a modular pumping unit (MPU) configured to couple to and facilitate pumping of coolant through a cooling apparatus assisting in removal of heat generated by one or more electronic systems. The modular pumping unit is a field-replaceable unit which couples to the cooling apparatus in parallel fluid communication with one or more other modular pumping units. In one embodiment, each modular pumping unit includes: a housing; a coolant inlet to the housing; a coolant reservoir tank disposed within the housing and in fluid communication with the coolant inlet; a coolant pump disposed within the housing and configured to pump coolant from the coolant reservoir tank; and a coolant outlet of the housing, the coolant pump being coupled in fluid communication between the coolant reservoir tank and the coolant outlet, wherein the coolant inlet and the coolant outlet facilitate coupling of the modular pumping unit in fluid communication with the cooling apparatus. The apparatus further includes a controller associated with the modular pumping unit. The controller controls the coolant pump of the modular pumping unit, and (in one embodiment) automatically adjusts operation of the coolant pump based, at least in part, upon one or more sensed parameters.

Figure 9:
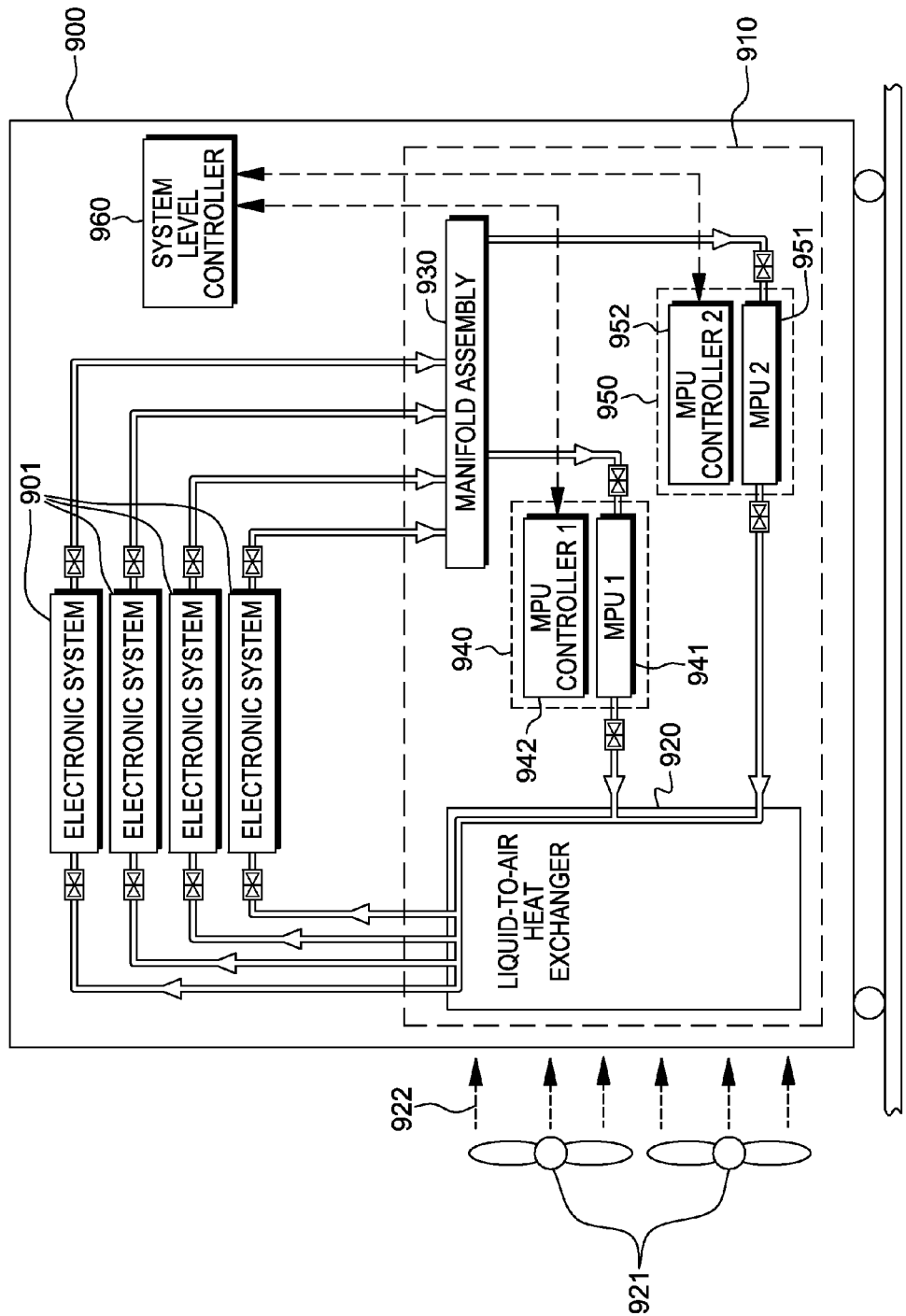
FIG. 9 depicts an alternate embodiment of a cooling system cooling one or more electronic systems and utilizing multiple modular pumping units (MPUs), in accordance with one or more aspects of the present invention.

For example, one or more coolant-level sensors may be associated with the coolant reservoir tank to sense coolant level within the coolant reservoir tank, and the controller may automatically adjust operation of the coolant pump based upon the sensed level of coolant within the coolant reservoir tank. Also, the modular pumping unit may include one or more coolant temperature sensors disposed to sense temperature of coolant passing through the housing, wherein the MPU controller automatically adjusts an operational speed of the coolant pump based upon coolant temperature sensed by the at least one coolant temperature sensor. If used with a cooling apparatus comprising a coolant-to-air heat exchanger, the MPU may be disposed so that a portion of the airflow across the coolant-to-air heat exchanger also passes through the MPU, allowing a temperature sensor to be incorporated into the MPU to sense temperature of airflow across the liquid-to-air heat exchanger. This sensed ambient air temperature may be employed to, for example, automatically adjust operation of the pump unit. Further details of such a modular pumping unit are described below in reference to the exemplary embodiment thereof depicted in FIGS. 9-12. Note in this regard, that the liquid-cooled electronic system of FIG. 9 is presented by way of example only. In particular, the modular pumping units disclosed herein may be employed with various different cooling apparatuses and systems, such as those described above in connection with FIGS. 2-8, as discussed further below.

More specifically, disclosed herein is a modular pumping unit which comprises a densely integrated, field-replaceable unit, which in one embodiment, provides substantially all functional and sensor needs for pumping and monitoring a liquid coolant used to cool, for example, one or more electronic components (such as one or more processor modules). The modular pumping unit is designed to couple, in parallel with one or more other modular pumping units, to a cooling apparatus comprising a heat exchange assembly, such as one or more of a liquid-to-liquid heat exchanger, a coolant-to-refrigerant heat exchanger, a coolant-to-air heat exchanger, etc., and may be located internal to, for example, an IT rack, or remotely from the one or more electronics racks or electronic systems being cooled by the cooling apparatus. In the embodiments disclosed herein, the apparatus further comprises a modular pumping unit controller, as well as a system-level (or frame-level) controller. The full-functional MPU disclosed herein provides coolant of the proper chemistry, filtering, and monitoring, to a customer's cooling apparatus, which includes the separate heat exchange assembly, and offers the ability of the customer to reject heat from the coolant to (for instance) the data center's water system, or to ambient air, or even to a refrigerant-based circuit, while cooling the same rack's or system's temperature-sensitive components. Redundancy at various levels is readily achieved by connecting in parallel fluid communication two or more such modular pumping units to, for example, coolant supply and coolant return manifolds of the cooling apparatus.

FIG. 9 is a schematic diagram of one embodiment of a liquid-cooled electronic system comprising, by way of example, an electronics rack 900 with multiple electronic systems 901 liquid-cooled via a cooling system or apparatus 910, which may be disposed internal to electronics rack 900 or external, and even remote from the electronics rack. The cooling system comprises, in this embodiment, a coolant-to-air heat exchanger 920, a coolant return manifold 930, and multiple pumping apparatuses 940, 950, each comprising a modular pumping unit 941, 951, in accordance with one or more aspects of the present invention. Advantageously, the modular pumping units 941, 951 are controlled to pump coolant through coolant-to-air heat exchanger 920 for distribution via the heat exchanger to, for example, one or more liquid-cooled cold plate (not shown) associated with the respective electronic systems 901. In this embodiment, the heat exchanger assembly is cooled by ambient air 922, with an airflow being provided by one or more air-moving devices 921. As explained further below, an MPU controller 1 942 is associated with first MPU 941, and an MPU controller 2 952 is associated with second MPU 951. The MPU controllers themselves facilitate cooling system control via a system-level controller 960.

In operation, heat generated within the electronic systems 901 is extracted by coolant flowing through (for example) respective cold plates, and is returned via the coolant return manifold 930 and the active modular pumping unit(s), for example, MPU #1 941 (in one example) to the coolant-to-air heat exchanger 920 for rejection of the heat from the coolant to the ambient air passing across the heat exchanger. In this example, only one modular pumping unit need be active at a time, and the MPU redundancy allows for, for example, servicing or replacement of an inactive modular pumping unit from the cooling system, without requiring shut-off of the electronic systems or electronics rack being cooled. By way of specific example, quick connect couplings may be employed, along with appropriately sized and configured hoses to couple, for example, the heat exchanger, cold plates, return manifold, and pumping units. Redundant air-moving devices 921, with appropriate drive cards, may be mounted to direct ambient airflow across the coolant-to-air heat exchanger. These drive cards may be controlled by system-level controller 960, in one embodiment. By way of example, multiple air-moving devices may be running at the same time.

The MPU controllers associated with the respective MPUs may be disposed on or within the respective MPU or, for example, associated with the MPU. In one embodiment, the MPU controllers can turn on/off the respective coolant pumps, as well as adjust speed of the coolant pump. The state of the MPU is relayed by the MPU controller 942, 952 to the system-level controller 960. The system-level controller 960 provides system level control for, at least in part, the cooling system. The system-level controller may be disposed, for example, within the electronics rack 900, or remotely from the electronics rack, for example, at a central data center location. As described below, the system-level controller determines, in one embodiment, when switchover of MPUs is to be made and, for example, determines when an MPU has a defect requiring switchover to a redundant MPU for replacement of the defective MPU.

As noted, although depicted in FIG. 9 with respect to a coolant-to-air heat exchanger, the field-replaceable, modular pumping units disclosed herein may provide pumped coolant (such as water) for circulation through various types of heat exchange assemblies, including a coolant-to-air heat exchanger, a liquid-to-liquid heat exchanger, a rack-mounted door heat exchanger, a coolant-to-refrigerant heat exchanger, etc. Further, the heat exchange assembly may comprise more than one heat exchanger, including more than one type of heat exchanger, depending upon the implementation. The heat exchange assembly, or more generally heat rejection device, could be within the liquid-cooled electronics rack, or positioned remotely from the rack.

The modular pumping unit(s) comprises a recirculation coolant loop which: receives exhausted coolant from the electronics rack into a coolant reservoir tank, pressurizes the coolant via a coolant pump (such as a magnetically coupled pump), passes the pressurized coolant through a check valve, and discharges the coolant back to the electronic systems of the electronics rack via the heat exchange assembly.

Figure 10:
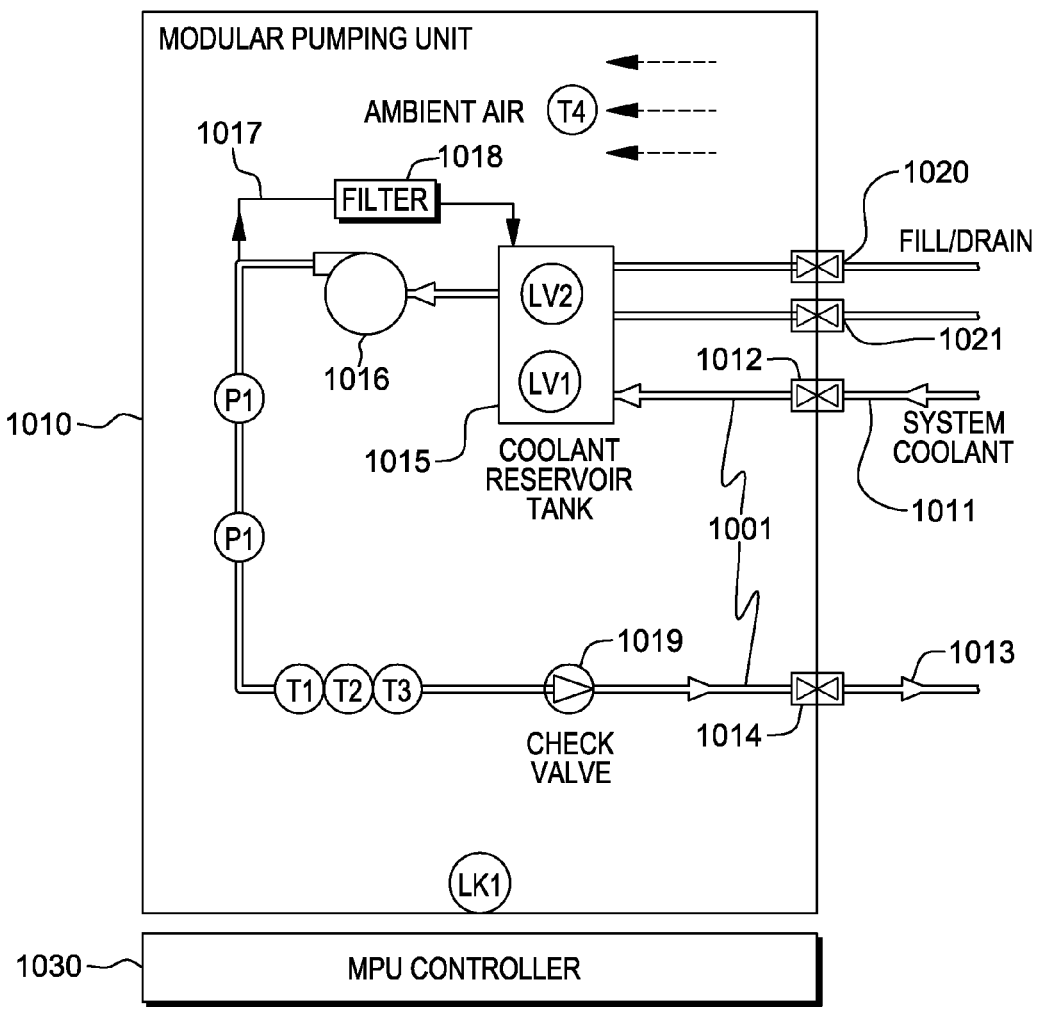
FIG. 10 is a schematic diagram of one embodiment of an apparatus comprising a modular pumping unit (MPU) and an MPU controller, in accordance with one or more aspects of the present invention.

FIG. 10 is a schematic diagram of one embodiment of a modular pumping unit, which may be employed with, for example, the cooling apparatus described above in connection with FIG. 9. In the embodiment illustrated in FIG. 10, modular pumping unit 1000 comprises a housing 1010 with a coolant inlet 1011 and a coolant outlet 1013. (In one implementation, housing 1010 may comprise a fluid-tight housing.) A coolant inlet quick connect coupling 1012 at coolant inlet 1011 and a coolant outlet quick connect coupling 1014 at coolant outlet 1013 are provided for facilitating coupling of the MPU to, for example, a cooling apparatus such as described above in connection with FIG. 9.

The modular pumping unit 1000 further comprises a coolant loop 1001 within the housing through which coolant received via the coolant inlet is re-circulated to the coolant outlet. As illustrated, coolant loop 1001 couples in fluid communication coolant inlet 1011 to a coolant reservoir tank 1015 and couples coolant reservoir tank 1015 via a coolant pump 1016 to coolant outlet 1013. A check valve 1019 is also provided within the coolant loop 1001 to prevent backflow of coolant into the modular pumping unit when the modular pumping unit is off, but coupled in fluid communication with the cooling apparatus. In one example, the coolant pump 1016 comprises a centrifugal pump, and a portion of the coolant pumped from coolant reservoir tank 1015 via the coolant pump 1016 is returned via a coolant return line 1017 through a coolant filter 1018 to the coolant reservoir tank 1015. One or more coolant fill or drain connections 1020, 1021 may be provided at housing 1010 into coolant reservoir tank 1015 to, for example, facilitate filling or draining of coolant or air from the coolant reservoir tank, and thereby facilitate field-replaceability of the modular pumping unit in parallel fluid communication with one or more other modular pumping units, without requiring shutdown of the respective electronic systems or electronics rack being cooled.

Advantageously, modular pumping unit 1000 further comprises multiple sensors, and has associated therewith an MPU controller 1030 for facilitating automated monitoring of coolant passing through the MPU, as well as operation of the MPU itself. In the depicted embodiment, modular pumping unit 1000 comprises, for example, a lower-level coolant reservoir sensor LV1, an upper-level coolant reservoir sensor LV2, an outlet pressure sensor P1, a coolant flow rate sensor F1, multiple coolant temperature sensors T1, T2 & T3, an ambient airflow temperature sensor T4, and a coolant leak sensor LK1. In one embodiment, these sensors are disposed within the MPU and allow the controller to control, for example, operation and/or an operational speed of coolant pump 1016, in order (for example) to provide an appropriate level of cooling to the electronic systems or rack. The MPU controller reads the sensed values and responds to the sensor values, along with providing diagnostic information to the system-level controller (such as described above in connection with FIG. 9). The sensors also provide information which can assist in the initial filling of the modular pumping unit, and the cooling system, and can indicate the need to, for example, top off a coolant level or to remove air pockets, as well as provide an indication that the coolant pump does not have sufficient coolant, requiring the coolant pump to be shut off to prevent damage. The sensors also provide diagnostic information to the system-level controller which can be used to determine, for example, the operational state of the modular pumping unit, and to act on that information.

Figure 11A:
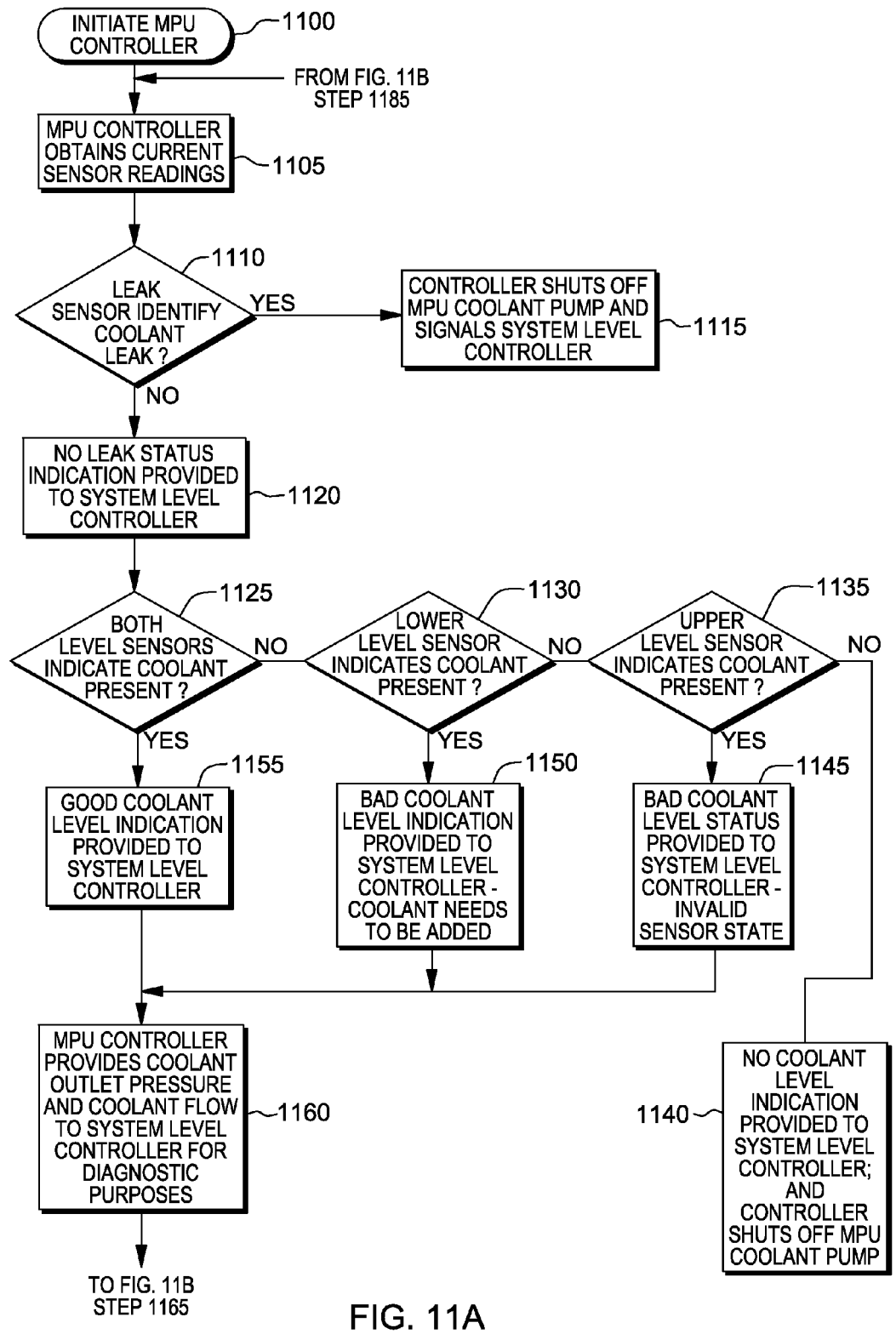
FIGS. 11A & 11B are a flowchart of one embodiment of a control process implemented by a modular pumping unit (MPU) controller, in accordance with one or more aspects of the present invention.
Figure 11B:
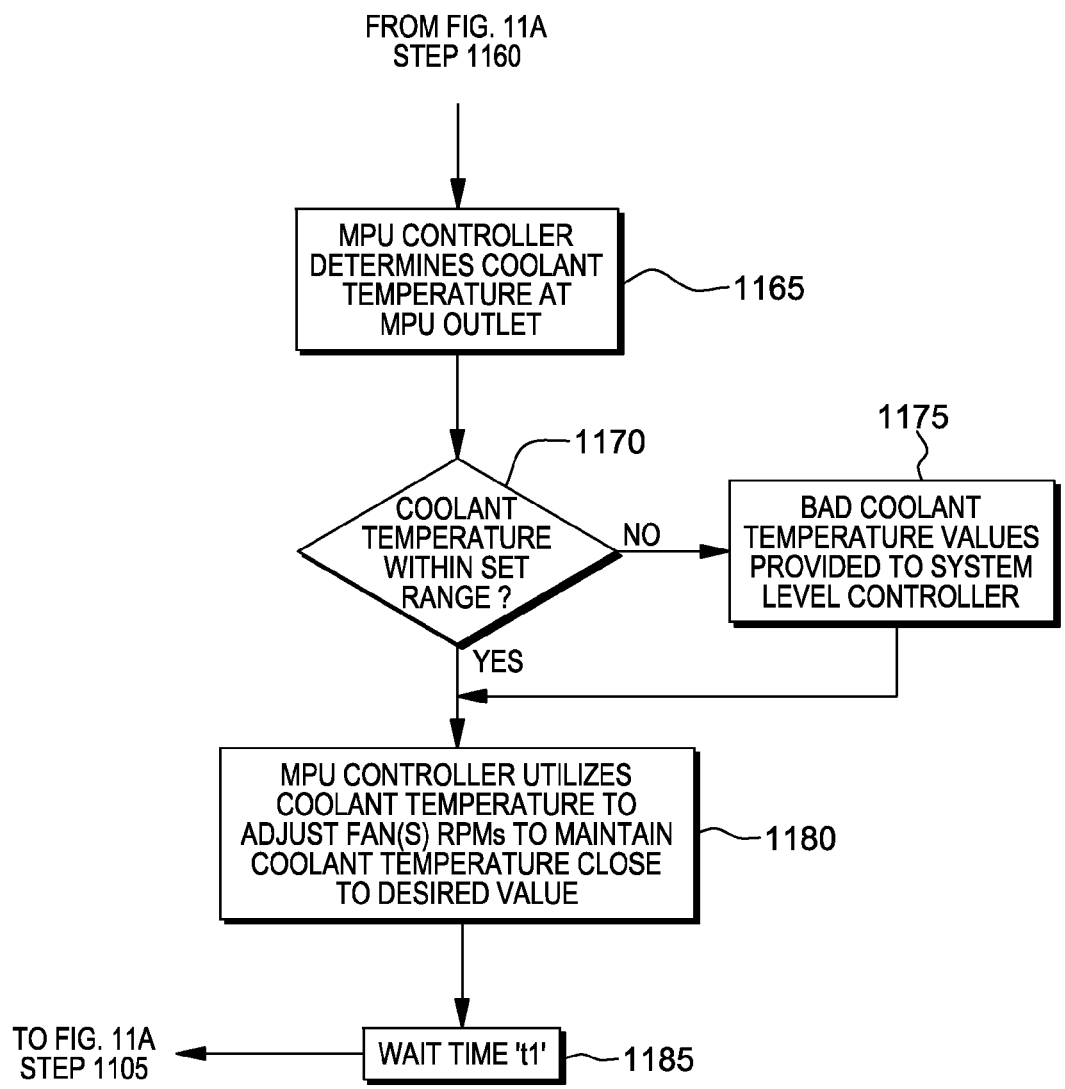

FIGS. 11A & 11B depict one embodiment of a control process implemented, for example, by an MPU controller of a modular pumping unit, such as described above in connection with FIGS. 9 & 10. Upon initiating MPU control 1100, the MPU controller obtains (for example, every t1 seconds) current sensor readings of the associated modular pumping unit 1105. Processing determines whether the leak sensor (LK1) indicates that there is a coolant leak 1110. If "yes", then the controller shuts off the MPU's coolant pump, and signals the system-level controller that there is a coolant leak 1115 (at which point the system-level controller switches the redundant modular pumping unit (or one of the redundant units) on to take over the pumping load for the cooling apparatus). Assuming that the leak sensor (LK1) does not indicate a coolant leak, then the MPU controller provides the system-level controller with a no leak status indication 1120.

The control process also determines whether both level sensors in the coolant reservoir tank indicate the presence of coolant 1125. If "no", then processing determines whether the lower-level sensor indicates the presence of coolant 1130, and if "no" again, determines whether the upper-level sensor indicates the presence of coolant 1135. If neither sensor indicates the presence of coolant, then the MPU controller provides a no coolant indication to the system-level controller, and shuts off the MPU's coolant pump 1140. Alternatively, if the upper-level sensor indicates the presence of coolant but not the lower-level sensor, then a bad coolant level signal is provided to the system-level controller, since an invalid sensor state has been identified 1145. If the lower-level sensor indicates the presence of coolant but not the upper-level sensor, then a bad coolant level indication is provided to the system-level controller, indicating that coolant needs to be added to the coolant reservoir tank 1150. If both level sensors indicate the presence of coolant, then a good coolant level indication is provided to the system-level controller 1155.

Additionally, the MPU controller may provide a coolant outlet pressure reading and a coolant flow reading to the system-level controller, for example, for diagnostic purposes 1160. The MPU controller may also determine the temperature of the coolant flowing, for example, to the MPU outlet 1165 (see FIG. 11B). This may be ascertained via a single temperature sensor, or multiple temperature sensors. In the embodiment of FIG. 10, three temperature sensors T1, T2, & T3, are employed. A valid average temperature for these temperature sensors may be created. Any value outside a possible acceptable range would not be included in the average, and if obtained, a bad status indication may be provided by the MPU controller to the system-level controller. In one implementation, the temperature differences may be ascertained (for example, T1–T2, T1–T3, and T2–T3). If the values are below a certain threshold, then the average of T1, T2 and T3 may be obtained. If the values are outside a limit or a range, then a poor coolant temperature is identified, and an appropriate status indication is provided to the system-level controller. In the embodiment of FIG. 11B, the MPU controller determines whether the coolant temperature is within a set range 1170, and if "no", forwards the bad coolant temperature value(s) to the system-level controller 1175.

Advantageously, the MPU controller may also utilize coolant temperature to adjust, for instance, speed of the one or more air-moving devices 921 (FIG. 9) to, for example, maintain coolant temperature close to a desired value 1180. After this automatic adjustment of the coolant pump, processing may wait time interval t1 1185 before obtaining a new set of sensor readings 1105. In one example, time interval t1 may be 1 second.

Figure 12:
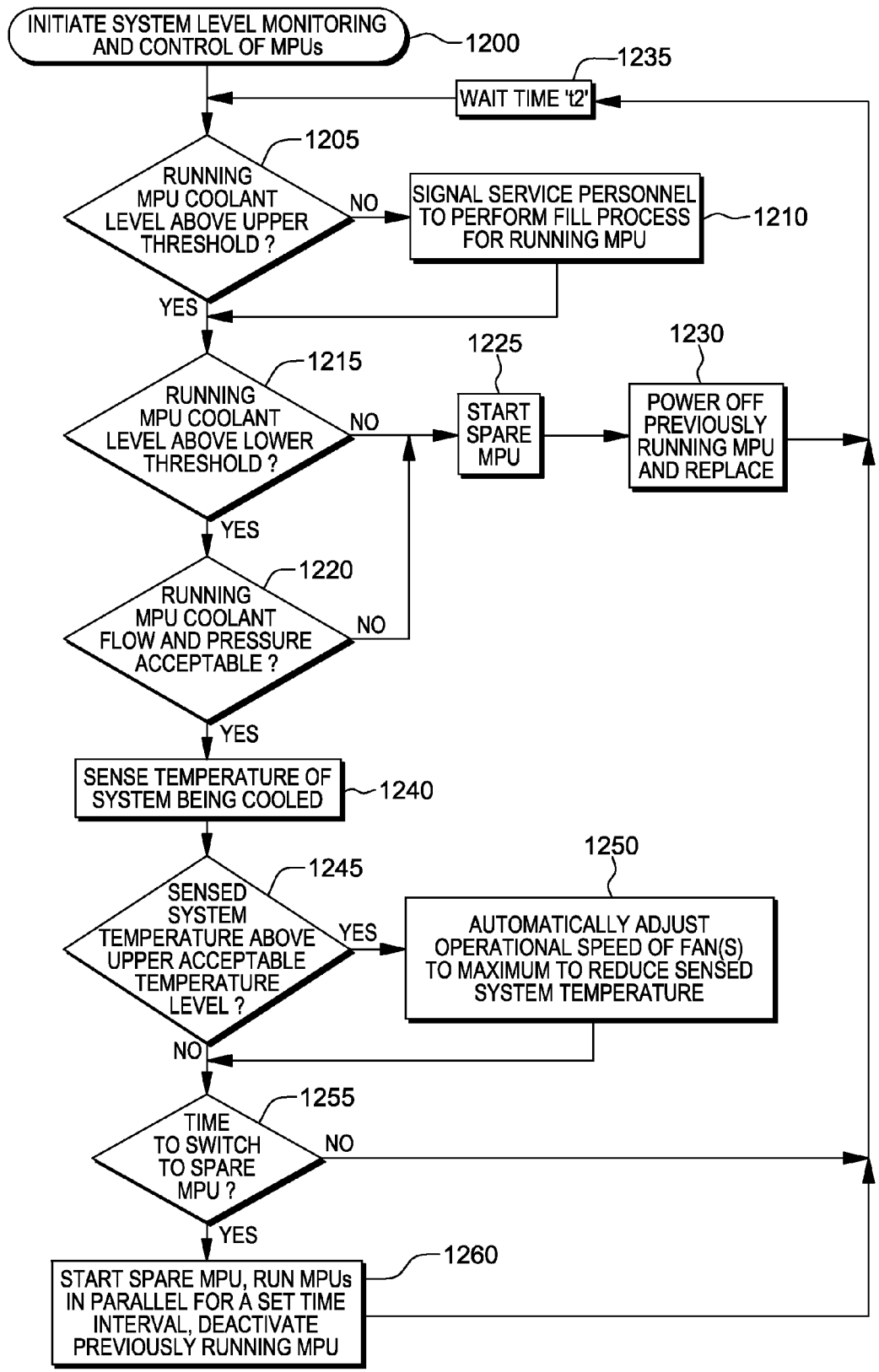
FIG. 12 is a flowchart of one embodiment of a control process implemented by a system-level controller of a cooling system comprising multiple modular pumping units (MPUs), in accordance with one or more aspects of the present invention.

FIG. 12 depicts one embodiment of processing implemented by a system-level controller. In this example, upon initiating system-level monitoring and control of the MPUs 1200, processing determines whether the running MPU's coolant level in the coolant reservoir tank is above an upper operational level 1205, for example, at or above the upper-level sensor in the coolant reservoir tank of FIG. 10. If "no", then service personnel is signaled to perform a coolant fill process for the active MPU 1210. Processing also determines whether the MPU coolant level is at or above a lower acceptable threshold 1215, and if "yes", whether the running MPU's coolant flow and pressure are above acceptable respective thresholds 1220. If either is "no", then a spare modular pumping unit that is coupled to in parallel fluid communication with the running MPU is started 1225, after which the previously running MPU is powered off and replaced 1230. Processing then waits a time interval t2 before again checking the coolant level within the coolant reservoir tank 1235. Assuming that the coolant level is acceptable, and that the flow and pressure readings are acceptable, the system-level controller ascertains one or more temperatures of the electronic system being cooled 1240, and determines whether the sensed electronic system temperature(s) is above an upper acceptable temperature threshold 1245. If so, then the system-level controller automatically adjusts operational speed of the one or more air-moving devices 921 (FIG. 9) to maximum to attempt reduction in the sensed system temperature 1250. After adjusting operational speed, or if system temperature is acceptable, processing determines whether it is time to switch the pumping function from the active, running MPU, to a spare MPU coupled in parallel fluid communication 1255. If "no", processing waits time t2 1235 before repeating the processing. If "yes", then the system-level controller initiates operation of a spare MPU, runs the two MPUs in parallel for a set time interval, and then deactivates the previously running MPU 1260, thereby accomplishing the switchover of the pumping load from the previously running MPU to the recently-started MPU. After switching pumping operation, processing waits time t2 1235, before again repeating the above-described processing.

Advantageously, disclosed hereinabove (in one implementation) is a modular pumping unit comprising a field-replaceable unit that comprises, for example, a single dense housing containing a multitude of functional and sensor requirements for a liquid-cooled electronic system including (for instance): coolant pumping; a reservoir for slowing down coolant to allow any entrained air to leave the coolant, as well as providing a location to replace any entrained air with coolant during a fill process; level sensing; leak sensing; ambient air temperature sensing; coolant flow rate sensing; pressure sensing; liquid filtering; drain and fill locations that enable draining and filling of the field-replaceable unit with coolant, either connected or disconnected from the full cooling apparatus; and an MPU controller comprising, for example, an MPU drive or control card which may be readily accessed, and thereby replaced by service personnel, if required.

Advantageously, provided herein (in one aspect) is an ability to field-service the above-noted modular pumping unit as a single field-replaceable unit, with the functionality thereof being concurrently maintained via at least one other MPU coupled therewith in parallel fluid communication to the cooling apparatus. A single MPU as a field-replaceable unit completes the cooling system, with the addition to several passive components, that is, a heat exchange assembly and one or more cold plates, along with interconnecting hoses. Advantageously, multiple MPUs may be operated in parallel to, for example, increase liquid coolant flow rate to a downstream heat exchanger and cold plates. To provide redundancy, at least one MPU is maintained as a spare MPU. That is, if only one MPU is required, then two MPUs are coupled in parallel fluid communication. If four active MPUs are desired at a time, then five or more MPUs are coupled in parallel fluid communication.

As noted, the heat exchanger (or heat exchange assembly) through which liquid coolant from the MPU is pumped may exchange its heat to, for example, air or other coolant or refrigerant, or other type of liquid. In this manner, a single MPU may be developed and qualified for many different heat sink applications. Further, the location of the heat exchanger may be within the electronics rack being cooled, or remote from the rack or electronic system, perhaps used in common with other electronics racks or systems within a data center. Associated with each MPU is an MPU controller which is used, in part, to read and respond to various MPU sensors, as well as control flow of coolant through the MPU (as described above by way of example only). A system-level controller may also be associated with the multiple parallel-connected MPUs. The system-level controller may read information from the multiple MPUs, and make control decisions to ensure that the cooling system runs uninterrupted, as well as control flows, as described above in one example with reference to FIG. 12.

In another aspect, disclosed herein is a multi-level redundant cooling system which facilitates cooling of one or more electronic systems of, for instance, an electronics rack. Electronic systems, such as high-end servers, may have processors and/or multichip modules with power density characteristics that make them difficult to air-cool only. For instance, an electronic system may have individual processors, each dissipating in excess of 300 Watts, packaged in a dense, multichip module, with total power exceeding 2000 Watts dissipated within, for instance, a 100 mm×100 mm area. Direct air-cooling to long-term reliable temperatures is not viable at these power rates. Additionally, the electronic systems at issue typically require continuous 24×7×365 operation, without interruption, for many years.

Cooling such high-powered systems or modules requires liquid coolant propelled by mechanical devices, such as the above-described modular pumping units. Air-moving devices may also be used to facilitate ultimate rejection of the coolant's heat to ambient air. Each of these mechanical devices is subject to failure modes from wear, vibration, fatigue, and other modes that are found in mechanical rotating equipment.

Additionally, when water or other coolant is the primary coolant, the cooling system requires plumbing, which invariably introduces leakage sites, particularly at locations where field service requires the coolant loops to be broken. Traditionally, when such a plumbing leak occurs in a liquid-cooled electronic system, the entire system needs to be shut down for repair, thereby disrupting customer operation.

Disclosed hereinbelow with reference to FIGS. 13-20 are certain enhanced, multi-level redundant cooling systems for facilitating cooling of one or more electronic systems, such as described above. In particular, the multi-level redundant cooling systems disclosed herein facilitate cooling high-powered multichip modules, provide maximum protection to processor frequency, and enable virtually all failure modes of the cooling system to be concurrently serviced, without interruption of the electronic system(s). The cooling system disclosed employs multiple levels of cooling redundancy to achieve this. In one embodiment, it is assumed that the multichip module power density is high enough that full circuit frequency cannot be supported long-term by direct air-cooling alone. In the example described below, a primary liquid-based cooling system is presented, where heat is ultimately rejected to air via an air-to-liquid heat exchanger. All active components in the cooling system, that is, components that involve rotating machinery or control electronics that are most likely to be failure sites, are fully redundant. Additionally, a secondary cooling (or backup cooling) subsystem is provided that employs temporary, direct air-cooling of the high-heat dissipating components (such as a multichip module comprising multiple processor chips). Although the backup enhanced air-cooling is less effective than the primary liquid-cooling, operation of the electronic system is allowed to continue. In this manner, a multi-level redundant cooling system is presented, which is primarily liquid-cooled, and is fully redundant should any electronic or mechanical moving component fails, and which includes, in the rare instance of failure of the primary coolant system (such as the case in a coolant leak), automatic, temporary backup air-cooling of the electronic system to allow the system to continue to function, for instance, at reduced frequency, while the primary liquid-cooling system is being repaired or replaced, thereby eliminating cooling as a source of electronic system (e.g., server) downtime.

In one aspect, disclosed herein is a cooling system which includes a coolant-based cooling apparatus that assists in removal of heat generated by one or more electronic systems of, for instance, an electronics rack. The coolant-based cooling apparatus includes one or more heat exchange assemblies, such as one or more coolant-to-air heat exchangers (or radiators) that discharge heat from coolant of the coolant-based cooling apparatus. In one embodiment, the coolant may comprise water or an aqueous-based solution. As noted, the cooling system is multi-level redundant. This redundancy includes, redundant pumping units, redundant backup blowers, and multiple separate controllers controlling the redundant pumping units and redundant backup blowers. The redundant pumping units may comprise redundant, modular pumping units, such as those described above. These pumping units facilitate pumping of coolant through the coolant-based cooling apparatus to assist in removal of heat generated by the electronic system(s), and discharge of the heat via the at least one heat exchange assembly. The redundant pumping units are coupled to the coolant-based cooling apparatus in parallel fluid communication to separately provide pumping of coolant through the cooling apparatus. In one implementation, the pumping units are sized and configured to separately, individually provide the desired coolant pumping through the cooling system. However, dependent on the particular mode (e.g., normal mode or failure mode) of the cooling system, one or both coolant pumps may be operational or non-operational, as described below.

The redundant backup blowers of the cooling system are disposed to provide a backup (or auxiliary) airflow across the one or more electronic systems, for instance, in the event of a failure of the coolant-based cooling apparatus, or the redundant pumping units, or environmental conditions outside of a specified envelope. The multiple separate controllers may include, for instance, redundant pumping unit controllers, and redundant backup blower controllers. In one embodiment, the multiple separate controllers may be configured, at least in part, as separate drive cards and be independently operable, and associated with a respective pumping unit or backup blower. In an enhanced implementation, redundant fans are associated with the at least one heat exchange assembly to facilitate an airflow across the at least one heat exchange assembly, and thereby discharge of heat from coolant of the coolant-based cooling apparatus passing through the at least one heat exchange assembly. These redundant fans may also have redundant fan controllers associated therewith. The multiple separate controllers may be coupled in communication with a system-level controller, which coordinates system-level functions of the cooling system. Each of the pumping units controllers and backup blower controllers controls (in one embodiment) operation of at least the respective pumping unit or backup blower based, at least in part, on one or more sensed parameters. In one embodiment, the one or more sensed parameters comprise one or more monitored temperatures associated with the one or more electronic systems to be cooled. For instance, each electronic system of multiple electronic systems may have associated therewith one or more temperature sensors to monitor respective temperatures. In such a case, the multiple separate controllers may take action based on, for instance, a highest monitored temperature, as explained further below. The backup blower controllers activate at least one or both of the redundant backup blowers, responsive to the one or more sensed parameters exceeding a set threshold to provide backup or auxiliary air-cooling of the one or more electronic systems, for instance, in the event of a degraded performance of the coolant-based cooling apparatus or the redundant pumping units.

Advantageously, the multi-level redundancy of the cooling system(s) disclosed herein allows for the cooling system(s) to remain operational, notwithstanding failure of any two of the cooling system's rotating mechanical devices or their associated control cards, such as the redundant pumping units, redundant backup blowers, redundant fans, or their separate controllers. Further, the multi-level redundant cooling system remains operational during servicing, for instance, of one of the redundant pumping units, the redundant pumping unit controllers, the redundant backup blowers, the redundant backup blower controllers, the redundant fans, or the redundant fan controllers. Additionally, the multi-level redundant cooling system disclosed herein allows for the electronic system(s) to remain operational, notwithstanding failure of the liquid-coolant-based portion of the cooling system, for instance, a failure of the coolant-based cooling apparatus as might be the case with a leak associated with (for example) the one or more coolant-to-air heat exchangers of the cooling apparatus. In such a case, the backup (or auxiliary) airflow subsystem is automatically activated to facilitate continued operation of the one or more electronic systems, although possibly with degraded performance using, for instance, cycle steering. Cycle steering is described in detail in various prior publications and/or patent applications of International Business Machines Corporation, including, for instance, U.S. Patent Publication No. 2007/0044493 A1.

By way of further example, reference a publication by Goth et al, entitled "Hybrid Cooling with Cycle Steering in the IBM eServer z990", IBM Journal of Research and Development, Volume 48, Issue: 3.4, pages 409-423 (May 2004). Briefly summarized, as (for instance) CMOS circuits become warmer, cycle steering allows for an automatic or inherent switching of the transistors at a slower frequency. Thus, when (for instance) processor circuits are being cooled to a higher temperature (for example, due to a transient condition such as using back-up air-cooling only), then processor switching frequency may be reduced. This reduction in frequency lowers the compute capacity of the processors, but allows the processors to continue operation. When temperature increases, "leakage" currents will also increase, and power increase in the circuits may be substantial. Thus, as part of cycle steering, voltage to the circuits is lowered as well, which helps to reduce any leakage current.

In another embodiment, redundant power supplies are also provided to power the one or more electronic systems. The redundant power supplies may include redundant power supply controllers which function, at least in part, to shut down the one or more electronic systems should, for instance, a monitored control temperature at the one or more electronic systems exceed a highest acceptable temperature, that is, in order to prevent hardware damage.

As noted, the multiple controllers are separate, and potentially independent, of each other, with one embodiment of the control process implemented by the multiple separate controllers being described further below with reference to FIGS. 17A-19.

FIGS. 13-16B depict embodiments of a cooled electronic assembly which comprises multiple electronic systems and a multi-level redundant cooling system, such as disclosed herein.

Figure 13:
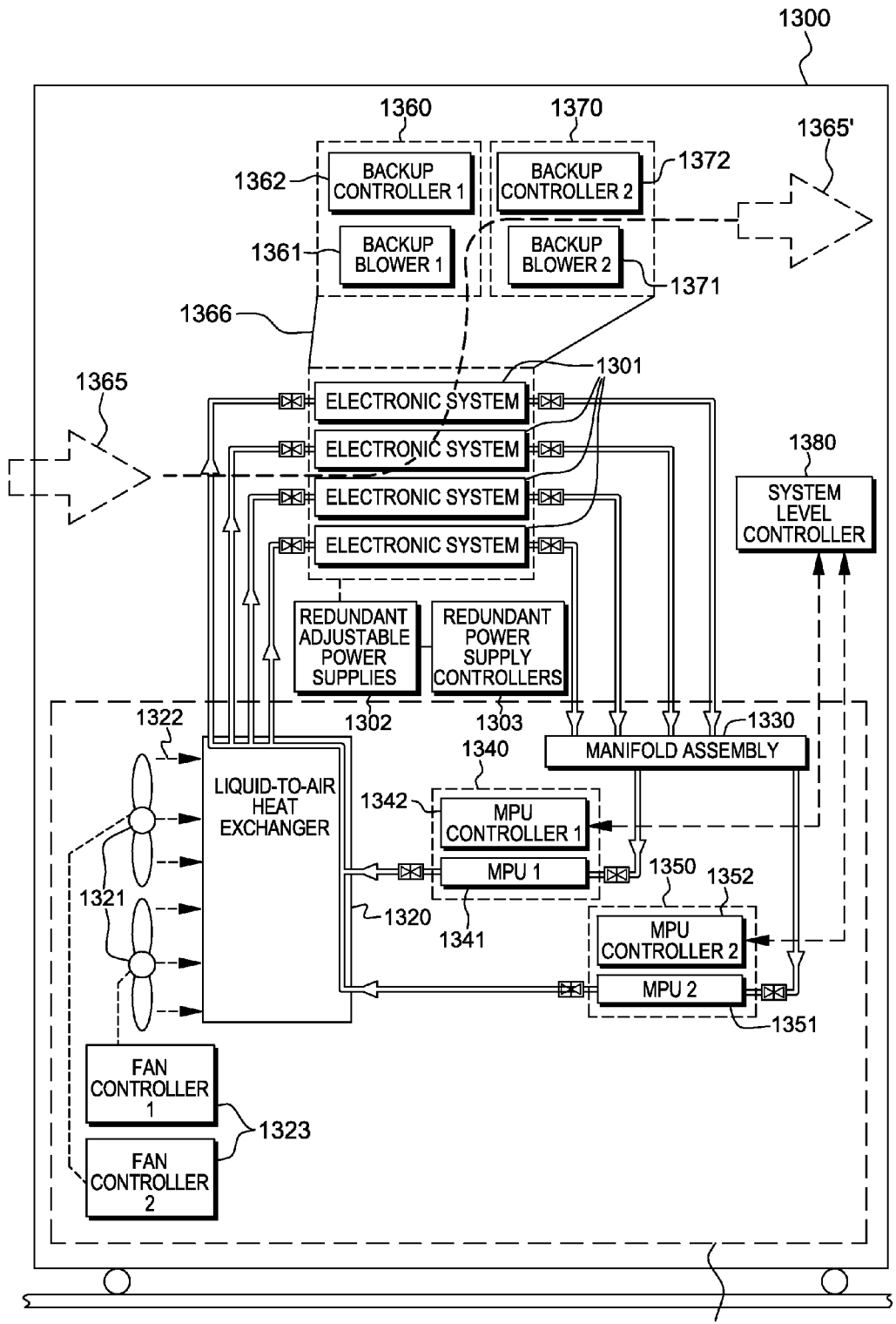
FIG. 13 depicts a further embodiment of a cooling system cooling one or more electronic systems, and including multiple levels of redundancy which ensure continued cooling (and thus operation) of the electronic system(s), in accordance with one or more aspects of the present invention.

Referring first to FIG. 13, a schematic diagram of one embodiment of such a multi-level redundant cooling system is shown to comprise, by way of example, an electronics rack 1300 with multiple electronic systems 1301, liquid-cooled via a coolant-based cooling apparatus 1310, which may be disposed internal to electronics rack 1300 or, in an alternate implementation, external, and even remote from, electronics rack 1300. The multi-level redundant cooling system comprises, in this embodiment, a coolant-to-air heat exchanger 1320, a coolant return manifold 1330, and multiple pumping apparatuses 1340, 1350, each comprising a modular pumping unit (MPU) 1341, 1351, in accordance with one or more aspects of the present invention. In one implementation, the multiple pumping units are redundant, and are controlled to pump coolant through coolant-to-air heat exchanger 1320 for distribution via the heat exchanger to, for example, one or more liquid-cooled cold plates (see FIG. 16B) associated with the respective electronic systems 1301. In this embodiment, the heat exchanger assembly is cooled by ambient air, with an airflow 1322 being provided by one or more air-moving devices, such as redundant fans 1321. In the depicted embodiment, redundant fans 1321 are independently controlled by redundant fan controllers 1323. As noted herein, redundant MPU controllers are also provided. These redundant controllers include an MPU controller 1 1342 associated with first MPU 1341, and an MPU controller 2 1352, associated with second MPU 1351.

In the embodiment of FIG. 13, the multi-level redundant cooling system further includes redundant backup blower apparatuses 1360, 1370, each of which comprises a backup blower 1361, 1371, in accordance with one or more aspects of the present invention. Note that although referred to herein as a backup blower, the redundant backup or auxiliary air-cooling provided by the redundant backup blowers may be implemented using any redundant air-moving devices, such as (for instance) fans or blowers. Advantageously, the redundant backup blowers 1361, 1371 are controlled to provide auxiliary (or supplemental) air-cooling to the electronic systems 1301 when operational by drawing an airflow 1365 into electronics rack 1300, and across the electronic systems 1301. Airflow ducting 1366 may be provided between redundant backup blowers 1361, 1371 and electronic systems 1301 to facilitate movement of airflow across the electronic systems, through the redundant backup blowers 1361, 1371, as well as facilitate rejection of heated airflow 1365' from electronics rack 1300. In the depicted embodiment, backup blower controller 1 1362 is associated with backup blower 1 1361, and backup blower controller 2 1372 is associated with backup blower 2 1371.

In the embodiment depicted in FIG. 13, redundant, adjustable power supplies 1302 are also provided for powering electronic systems 1301. These redundant, adjustable power supplies 1302 are controlled, in one embodiment, via redundant power supply controllers 1303, wherein, in one instance, each power supply controller of the redundant power supply controllers controls a respective adjustable power supply of the redundant, adjustable power supplies 1302.

The multiple redundant controllers, including redundant pumping unit controllers 1342, 1352, redundant fan controllers 1323, redundant power supply controllers 1303, and redundant backup blower controllers 1362, 1372, are (in one embodiment) implemented as separate controllers controlling the associated pumping unit, fan, power supply, or backup blower. These multiple controllers are (in one embodiment) independent of each other, and facilitate cooling system control via, for instance, communication with a system-level controller 1380, which may be disposed within electronics rack 1300, or remote from the electronics rack.

In operation, heat generated within the electronic systems 1301 and extracted by coolant flowing through (for example) respective cold plates, is returned via the coolant return manifold 1330 and the active modular pumping unit(s) (MPU), for example, MPU1 1341 (in one example) to the coolant-to-air heat exchanger 1320 for rejection of the heat from the coolant to the ambient air 1322 passing across the heat exchanger. In operation, only one modular pumping unit may (depending on the mode) be active at a time, and the MPU redundancy allows for, for example, servicing or replacement of an inactive modular pumping unit from the cooling system, without requiring shut-off of the electronic systems or electronics rack being cooled. By way of specific example, quick connect couplings may be employed, along with appropriately sized and configured hoses to couple, for example, the heat exchanger, cold plates, return manifolds, and pumping units. Redundant air-moving devices, that is, redundant fans 1321, with appropriate, redundant drive cards or controllers 1323, may be mounted to direct ambient airflow across the air-to-coolant heat exchanger. These controllers may be in communication with system-level controller 1380, in one embodiment. In one normal mode implementation, the multiple fans 1321 or other air-moving devices, may be running at the same time.

As noted, auxiliary (or backup) air-cooling may be provided across the electronic systems 1301, for instance, in the case of a failure of the coolant-based cooling apparatus 1310 which requires shut-off of coolant flow to the electronic systems 1301. In such a case, airflow 1365 is drawn through the rack from an air inlet side to an air outlet side thereof via redundant backup blowers 1361, 1371 and appropriate airflow ducting 1366. Note in this regard, that in one embodiment, the auxiliary airflow cooling apparatus, that is, the redundant backup blowers, are disposed above the multiple electronic systems within the electronics rack, and the coolant-based cooling apparatus 1310 is disposed below the multiple electronic systems to be cooled, as in the schematic of FIG. 13. As noted, in one embodiment, redundant adjustable power supplies 1302 power electronic systems 1301, and are controlled by redundant power supply controllers 1303. The separate redundant controllers, including the redundant pumping unit controllers, redundant fan controllers, redundant backup blower controllers, and redundant power supply controllers, may be on or within the respective component being controlled or, for example, associated with that component. In one embodiment, the pumping unit controllers can turn on/off the respective coolant pump 1341, 1351, as well as adjust speed of the coolant pump, the fan controllers 1323 can turn on/off the receptive fan 1321, as well as adjust speed of the fan, the power supply controllers can turn on/off the respective power supply 1302, as well as adjust the frequency and voltage of power supplied to the electronic systems 1301 (for instance, in accordance with a cycle steering approach), such as described herein, and the backup blower controllers 1362, 1372, can turn on/off the respective backup blower 1361, 1371, as well as adjust speed of the backup blower. The controllers may turn on/off and adjust speeds of the respective components in accordance with one or more control processes, such as the control process described hereinbelow with reference to FIGS. 17A-19.

The states of the multiple redundant controllers can be relayed to system-level controller 1380. The system-level controller 1380 may provide system-level control for, at least in part, the cooling system, and (as noted) may be disposed, for example, within electronics rack 1300, or remote from the electronics rack, for example, at a central data center location. As described below, the system-level controller determines, in one embodiment, when switch-over of MPUs is to be made, and (for example) determines when an MPU has a defect requiring switch-over to a redundant MPU for replacement of the defective MPU. In addition, the system-level controller may determine when a defect in the coolant-based cooling apparatus requires activation of the auxiliary airflow across the electronic systems.

As noted, although depicted in FIG. 13 with respect to a coolant-to-air heat exchanger, the multi-level redundant cooling system(s) disclosed herein may provide pumped coolant (such as water) for circulation through various types of heat exchange assemblies, including a coolant-to-air heat exchanger, a liquid-to-liquid heat exchanger, a rack-mounted door heat exchanger, a coolant-to-refrigerant heat exchanger, etc. Further, the heat exchange assembly may comprise more than one heat exchanger, including more than one type of heat exchanger, depending upon the implementation. The heat exchange assembly, or more generally, heat rejection device, could be within the liquid-cooled electronics rack, or positioned remotely from the rack.

Figure 14:
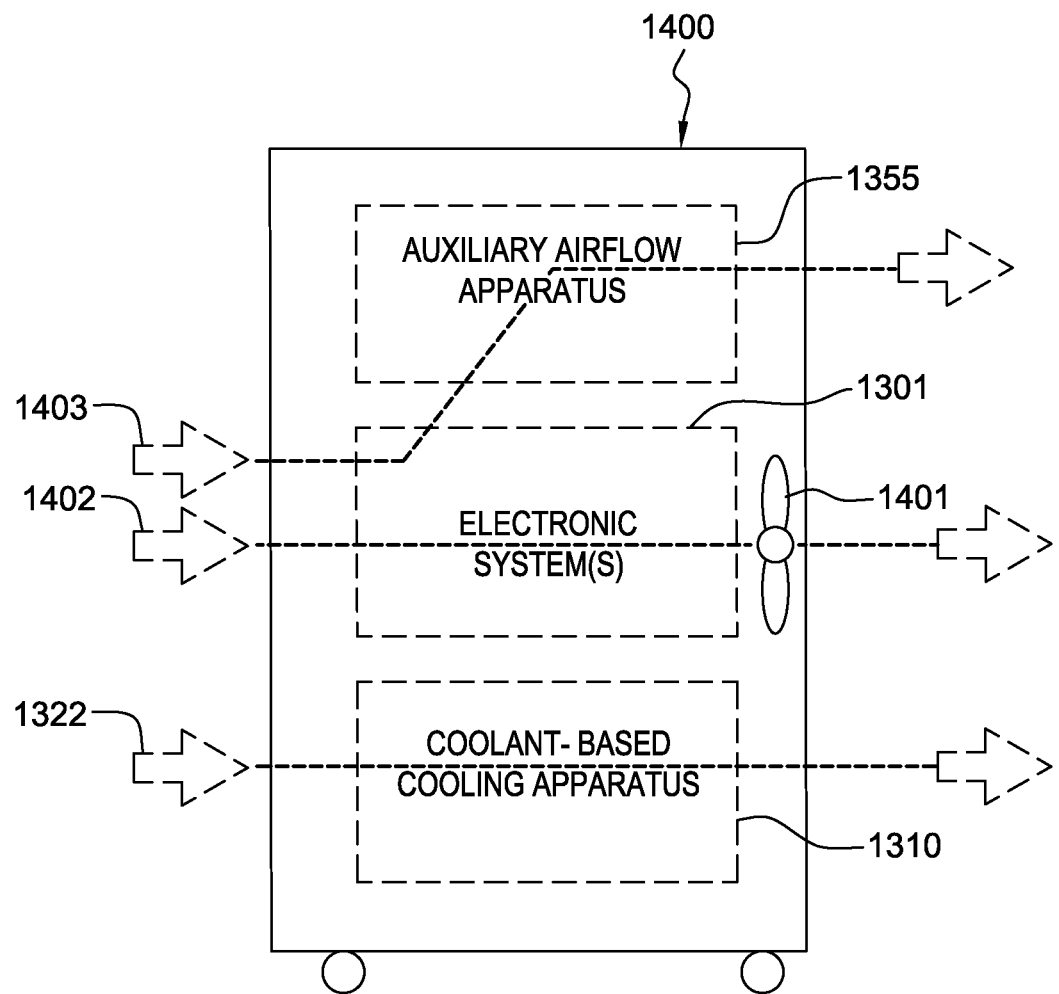
FIG. 14 is a schematic view of one embodiment of a cooled electronic assembly comprising one or more electronic systems and another embodiment of a multi-level redundant cooling system, in accordance with one or more aspects of the present invention.

FIG. 14 is a schematic of an enhanced embodiment of an electronics rack 1400 comprising, for instance, coolant-based cooling apparatus 1310, multiple electronic systems 1301, and auxiliary airflow apparatus 1355, such as the redundant backup blower apparatuses 1360, 1370 of FIG. 13. In this embodiment, a primary air-moving device 1401 is also provided to provide a primary airflow 1402 across the electronic systems 1301. In one implementation, in normal mode operation, airflow 1322 is drawn through coolant-based cooling apparatus 1310 via one or more fans 1321 (see FIG. 13), and a primary airflow 1402 is drawn across electronic systems 1301 via primary air-moving device 1401. In a failure mode, for instance, in the case of shut-down of the coolant-based cooling apparatus 1310, auxiliary airflow apparatus 1405, such as the above-described, redundant backup blowers 1360, 1370 of the multi-level redundant cooling system described above in connection with FIG. 13, may be activated to provide a backup or auxiliary airflow 1403 to supplement the primary airflow, and thereby temporarily provide temporary, enhanced airflow cooling of electronic systems 1301, for instance, as needed for repair or replacement of one or more components of the coolant-based cooling apparatus 1310, while allowing the electronic system(s) to remain operational.

Figure 15A:
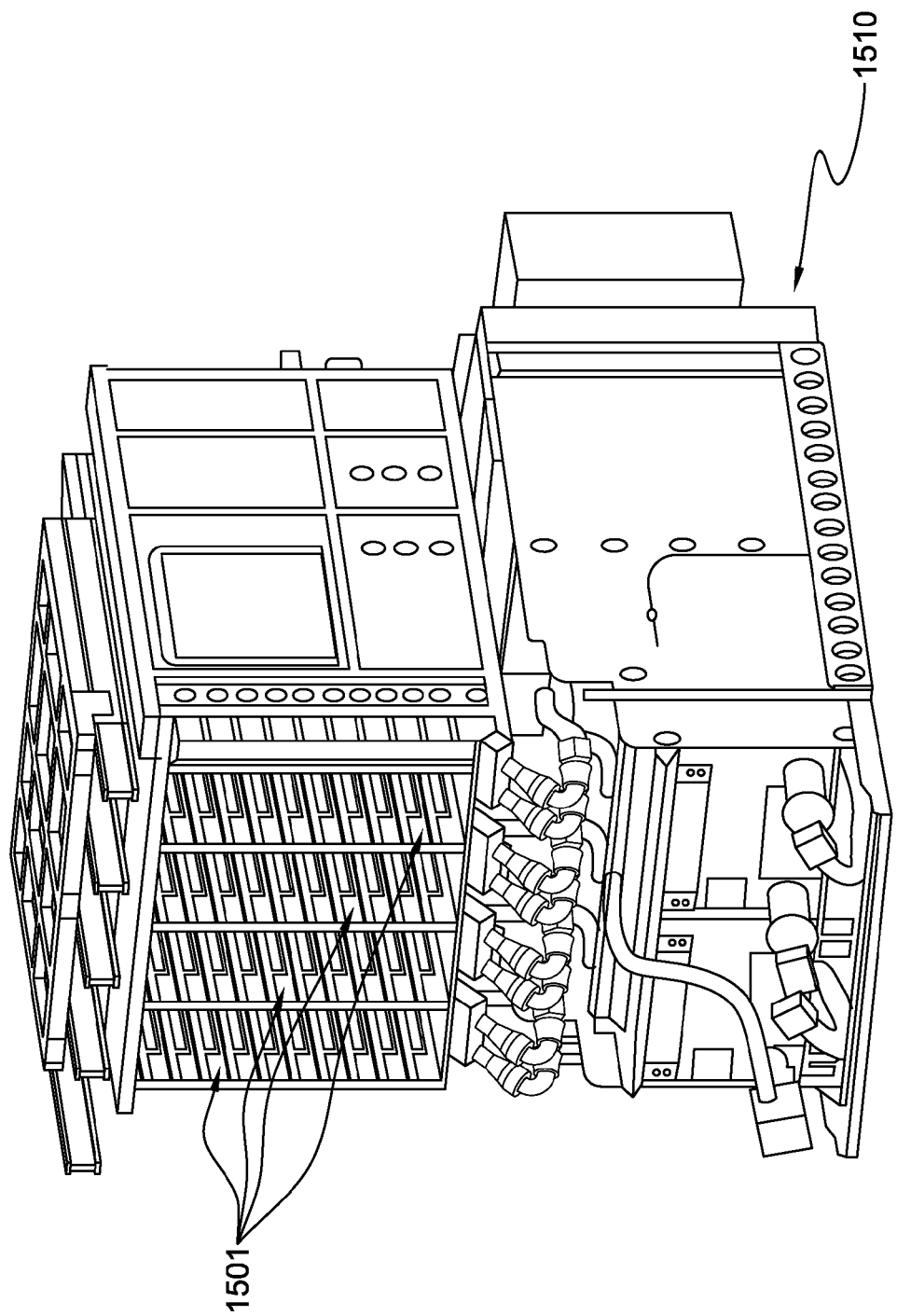
FIG. 15A depicts one detailed embodiment of a partially-assembled, cooled electronic assembly comprising multiple electronic systems and a multi-level redundant cooling system, in accordance with one or more aspects of the present invention.
Figure 15B:
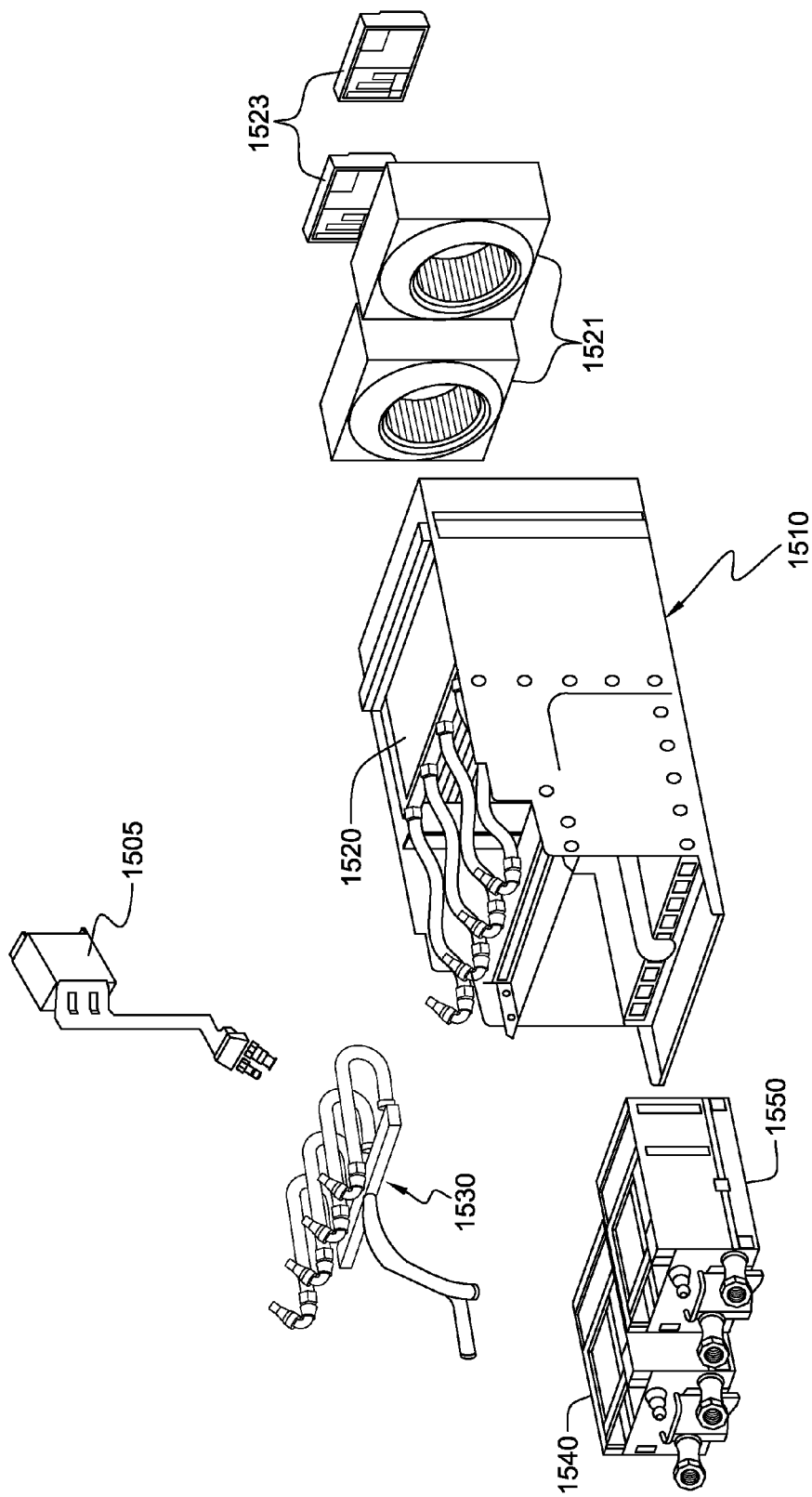
FIG. 15B is a partially exploded view of one embodiment of a portion of the multi-level redundant cooling system of FIGS. 13 & 15A, in accordance with one or more aspects of the present invention.

As noted, FIGS. 15A-16B depict one detailed embodiment of a cooled electronic assembly comprising a multi-level redundant cooling system, such as disclosed herein. Referring collectively to FIGS. 15A & 15B, multiple electronic systems, such as multiple processor books 1501, are disposed in one embodiment over a coolant-based cooling apparatus 1510 (such as the coolant-based cooling apparatus 1310 described above in connection with FIG. 13). Note with reference to FIG. 15A the placement of coolant-based cooling apparatus 1510 directly below the multiple electronic systems, or processor books 1501 to be cooled. In normal operation, liquid-based cooling is provided by the multi-level redundant cooling system through the flowing coolant and the cold plates associated with the multiple electronic systems (e.g., processor books). Heat is dissipated to ambient air drawn through the coolant-based cooling apparatus 1510 via, for instance, fans, blowers, or other air-moving devices 1521, having associated redundant fan controllers 1523, such as the fans and fan controllers described above in connection with the cooling system embodiment of FIG. 13. Further, as with the multi-level redundant cooling system of FIG. 13, the coolant-based cooling apparatus 1510 of the specific embodiment depicted in FIGS. 15A-15B includes a coolant-to-air heat exchanger 1520, and redundant pumping apparatuses 1540, 1550, as well as a coolant return manifold assembly 1530. In FIG. 15B, one cold plate assembly 1505 is also depicted (by way of example), which would be coupled in fluid communication with the coolant supply manifold assembly of the coolant-to-air heat exchanger 1520, and be coupled in thermal communication with (for instance) a processor book (or multichip module) 1501 of the electronic system being cooled.

Figure 16B:
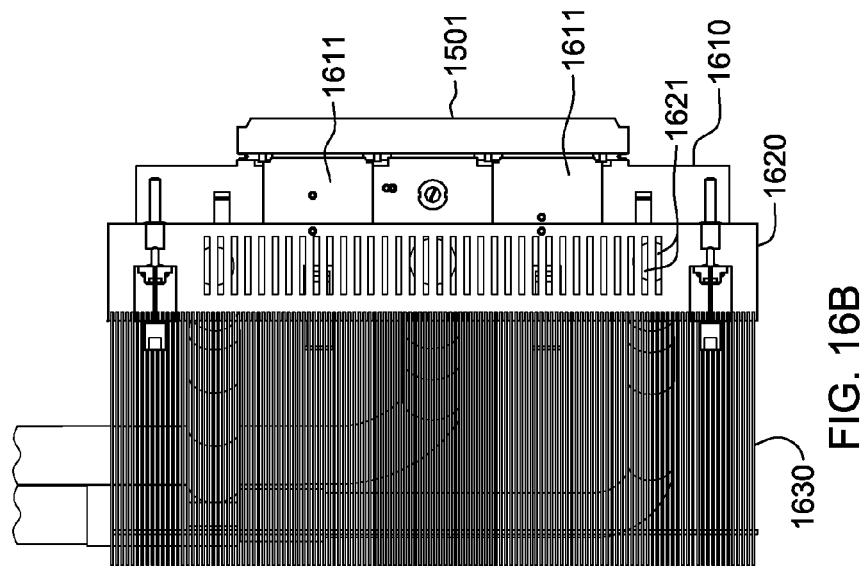
FIG. 16B is a cross-sectional elevational view of the multichip module, liquid-cooled cold plate, and air-cooled heat sink fins of FIG. 16A, taken along line 16B-16B thereof, in accordance with one or more aspects of the present invention.
Figure 16A:
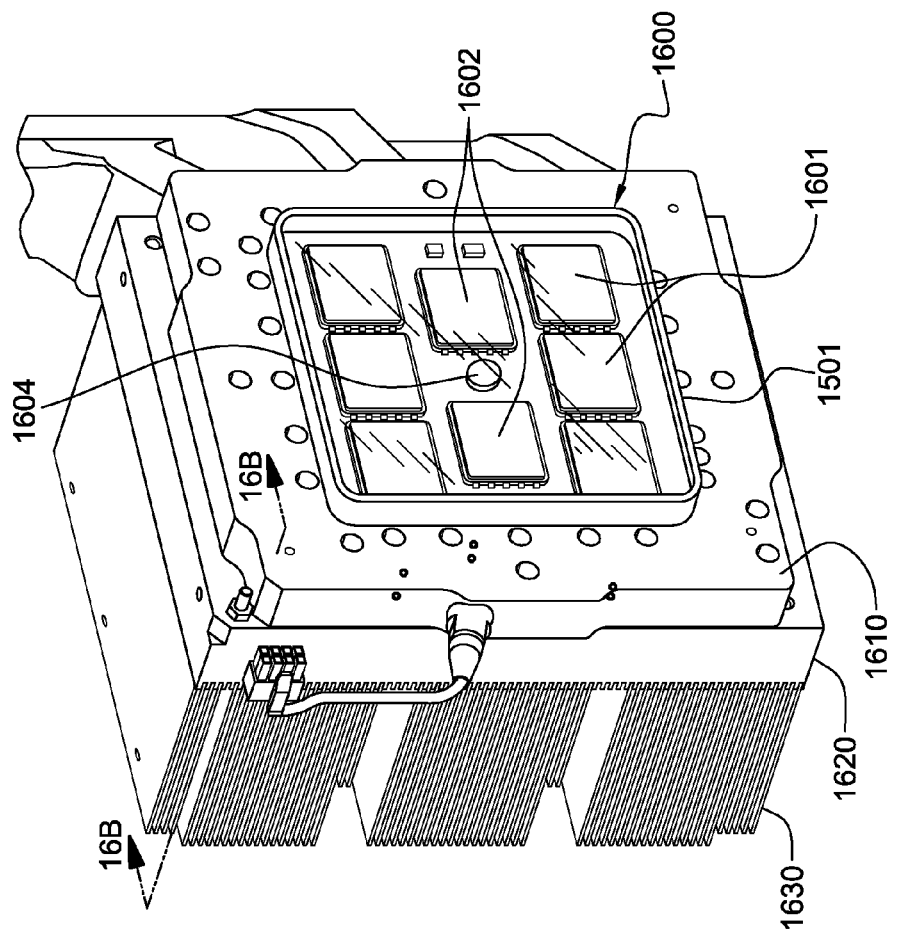
FIG. 16A depicts one embodiment of a multichip module of an electronic system to be cooled by a multi-level redundant cooling system which includes a liquid-cooled cold plate, and backup heat sink fins, in accordance with one or more aspects of the present invention.

FIGS. 16A & 16B depict one example of an electronic system, such as a processor book 1501 (FIGS. 15A & 15B), to be cooled employing a multi-level redundant cooling system such as disclosed herein. Referring collectively to FIGS. 16A & 16B, the electronic system is shown to comprise a processor book, or more generally, a multichip module 1600 comprising (for instance) multiple processors 1601 and support chips, such as cache chips 1602, packaged into a module which includes (in one instance) a centrally disposed temperature sensor 1604 that monitors a temperature of the multichip module. This monitored module temperature may be used as the monitored control temperature (i.e., one example of a sensed parameter) by which control of the various redundant components described herein may be based. A heat spreader 1610 is provided in this example to facilitate distribution and conduction of heat to a liquid-cooled cold plate 1620, which as illustrated in the cross-sectional view of FIG. 16B, may comprise multiple coolant-carrying channels 1621. A plurality of air-cooled heat sink fins 1630 are attached to the back side of coolant-cooled cold plate 1620 to facilitate transfer of heat to a backup airflow passing across the air-cooled heat sink fins 1630 (for example, in a failure mode). Note that in one embodiment, heat sink 1610 might comprise multiple adjustable conductive plugs 1611 aligned, for instance, to the processors 1601 arrayed within the multichip module. These plugs may be provided to facilitate good conduction of heat from the processors to the coolant-cooled cold plate 1620. Note also that the specific multichip module example of an electronic system to be cooled illustrated in FIGS. 16A & 16B is provided by way of example only, and that the multi-level redundant cooling system disclosed herein can be employed with any electronic system requiring cooling. However, the packaging density and heat dissipation specifications of a multichip module (e.g., processor book) such as illustrated in FIGS. 16A & 16B dictate an aggressive cooling system implementation, such as disclosed herein.

In one implementation, the air-cooled heat sink fins attached to the back side of coolant-cooled cold plate 1620 may be coupled via backup blower ducting to redundant backup blowers, which may be selectively activated as described herein, for instance to facilitate cooling of the electronic system(s) during repair of the coolant-based cooling apparatus of the multi-level redundant cooling system. Another valuable function of this backup air-cooling subsystem for a predominantly liquid-cooled cooling approach, is that the backup subsystem provides additional (or auxiliary) cooling, above and beyond what the liquid-cooling system can itself provide. This may be useful in a case where the redundant active components of the primary liquid-cooled cooling apparatus have partially failed, with the cooling available for the primary liquid-cooled path being slightly diminished. Also, in the case where the customer is running a highly unusual application program that consumes more power than the electronic system (e.g., server) was intended to support, or in the case where one or more of the environmental parameters that the customer is operating in (for instance, ambient temperature or altitude) are slightly higher than the electronic system was specified to support. In such cases, the auxiliary direct air-cooling provided by the backup blower apparatuses being turned on concurrently, with the still-functioning primary cooling loop, may advantageously allow the customer to maintain full frequency system operation, even if the customer's application or the environment within which the customer is operating, is beyond specified levels normally supported by the electronic system and/or cooling system.

In one embodiment, control of the coolant-based cooling apparatus, including the redundant pumping units and redundant fans, as well as the redundant backup blowers, and electronic system temperature protection, are independent of each other. Various control processes may be provided to achieve this independence. Described hereinbelow with reference to FIGS. 17A-19 are several detailed examples of control processes which may be implemented by a multi-level redundant cooling system, such as described herein.

In general, certain nominal conditions of the cooling system may be stated. These include that one pumping unit is on, and the other pumping unit of the redundant pumping units is off during normal operation. Upon passage of a set time, such as once a week, the pumping units may switch states. During the transition, both pumping units may be on for a period of time, for instance, ten minutes, to verify that the pumping unit turning on is free of fault. Further, in normal operation mode, both fans associated with the heat exchange assembly may be on, and both backup blowers, may be off. Outage or repair modes may include repair of one pump unit, which as noted above, may comprise a modular, field-replaceable pump unit, while the second pump unit is operating normally. In such a case, there is minimal thermal impact to the electronic systems being cooled. In another outage/repair mode, one fan of the redundant fans associated with the heat exchange assembly, or one fan controller of the redundant fan controllers, may have a fault and require repair/replacement. In one embodiment, these components are also field-replaceable units, and in such a repair mode, the remaining operating fan functions in a "high speed" state to temporarily make up for the lost airflow while the fan or fan controller with the fault is replaced or repaired. Should the entire liquid-based cooling apparatus have a fault, as might be the case with a coolant leak, then the backup blowers are activated for a period of time in order to allow for repair or replacement of the fault. Combined with activation of the backup blowers, reduced frequency operation of the electronic systems may be employed in order to ensure continued operation of the cooled electronic assembly.

In one implementation, the pumping units are monitored for a hardware fault, and the backup blowers are monitored for a hardware fault as well. These monitored fault conditions may be employed (for instance) as discussed further below in connection with the control processes of FIGS. 17C & 17D, respectively. Component faults may be monitored employing a number of measurements. For instance, detecting faults in a cooling system may be via: (1) reading temperature of one or more monitored components (such as thermistor temperature at the module hat (see FIGS. 16A-16B); (2) ascertaining temperature of returning coolant or supplied coolant to the electronics; or (3) by measuring current to, for instance, the pump motor, which may serve as an indicator of a coolant flow problem, etc. As described herein, and as depicted (for instance) in FIG. 19, component temperature (such as hat thermistor temperature) may be employed independently to trigger on the back-up blowers or fans to provide auxiliary cooling, and to also adjust speed of the back-up blowers, as required. This is shown in FIG. 17B, and described below. Note that in accordance with the concepts disclosed herein, it does not matter that an over-temperature condition is caused by no coolant, restricted coolant flow, or room ambient temperature above a supported temperature level for full frequency operation of the one or more air-moving devices cooling the coolant, etc. For these and any other reasons, the back-up blowers simply respond to, for instance, multichip module hat temperature, and are activated and adjusted when set thresholds are crossed.

Note that in the detailed control process examples of FIGS. 17A-19, numerous set point temperatures are employed by the control processing in order to determine actions to be taken or removed. These temperature set points are provided herein by way of specific example only, and not by way of limitation. That is, those skilled in the art will understand that more or less temperature set points may be employed in one or more of the control processes described herein, and/or different temperature set points may be employed. Still further, different sensed parameters other than monitored control temperature(s) may be used to control operation of the multi-level redundant cooling system. In one example, another sensed parameter might comprise power drawn by the respective electronic systems.

Figure 17A:
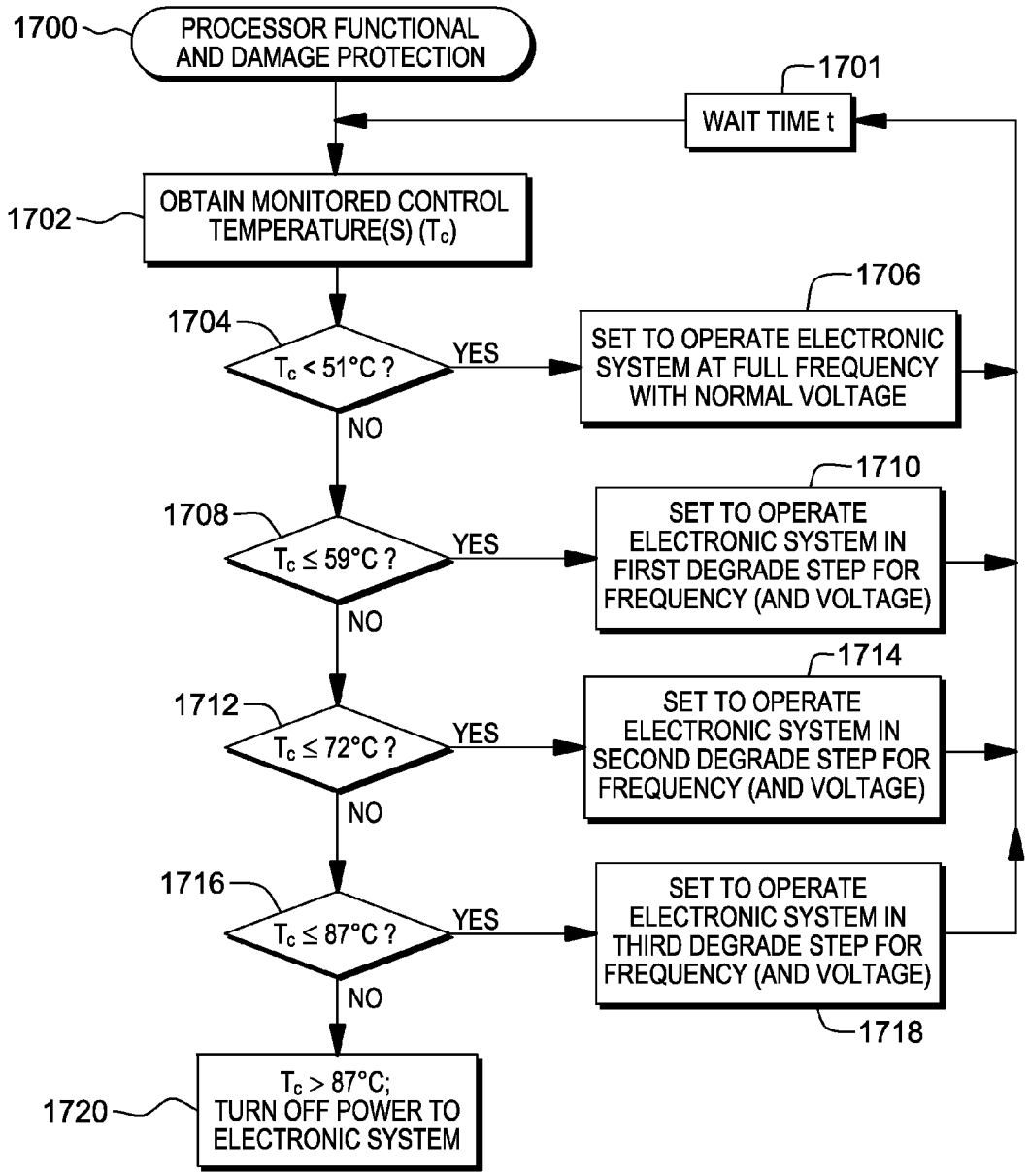
FIG. 17A depicts one embodiment of control processing implemented by, for instance, a system-level controller or a power supply controller of a cooled electronic assembly such as depicted in FIG. 13, in accordance with one or more aspects of the present invention.
Figure 17B:
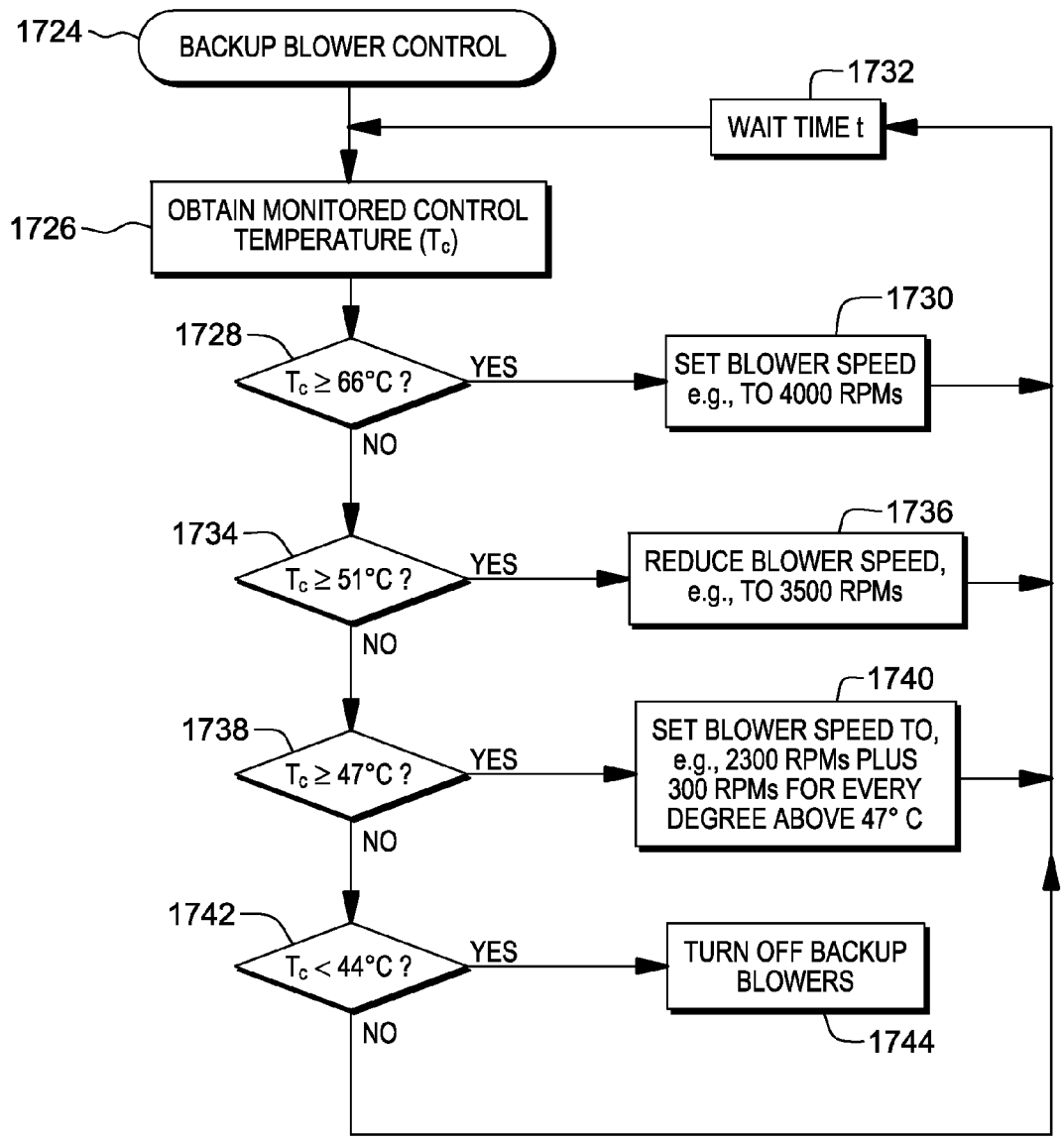
FIG. 17B depicts one embodiment of control processing implemented by, for instance, a backup blower controller to control operation of the redundant backup blowers of a multi-level redundant cooling system, such as depicted in FIG. 13, in accordance with one or more aspects of the present invention.

FIG. 17A depicts one embodiment of a control process for controlling (for example) processor function and providing damage protection 1700 for an electronic system being cooled. In this process example, which may be implemented (for instance) by each power supply controller of the redundant power supply controllers, one or more component or control temperatures ($T_c$) are obtained 1702. For instance, each electronic system may have a temperature sensor associated with a respective multichip module, and the highest monitored control temperature may be employed in the control processes described herein. Processing initially determines whether the monitored control temperature(s) is less than, for instance 51° C. 1704, and if "yes", then the power supply is set to operate the electronic system, or more particularly, the processors, at full frequency with specified normal voltage 1706, after which processing waits a time interval t 1701 before again obtaining the monitored control temperature 1702, and repeating the process.

As illustrated, various temperature ranges are defined, each with an associated respective degraded performance level, achieved using (for instance) cycle steering for continued operation of the electronic system, as summarized above. Assuming that the monitored control temperature(s) ($T_c$) is at or above 51° C., then processing determines whether the monitored control temperature(s) ($T_c$) is at or below 59° C. 1708. If "yes", then power supply is adjusted to operate the electronic system (and in particular, the multichip module comprising the multiple processors) in a first degrade step for both frequency and voltage 1710, after which processing waits time interval t 1701 before again obtaining the monitored control temperature(s) ($T_c$) 1702. Assuming that the monitored control temperature ($T_c$) is greater than 59° C., then processing determines whether the monitored control temperature is less than or equal to 72° C., that is, is in a range of 60° C.-72° C. 1712. If "yes", then the power supply is adjusted to operate the electronic system in a second degrade step for both frequency and voltage 1714, after which processing waits time interval t 1701 before again obtaining the monitored control temperature(s). Assuming that the monitored control temperature(s) ($T_c$) is greater than 72° C., processing determines whether the monitored control temperature ($T_c$) is less than or equal to 87° C. 1716, that is, in a range between 73° C.-87° C. If so, then the power supply is adjusted to operate the electronic system (or more particularly, the multichip module comprising the multiple processors) in a third degrade step for both frequency and voltage 1718, after which processing returns to wait time interval t 1701 before again obtaining the monitored control temperature(s) 1702. In this example, if the monitored control temperature(s) ($T_c$) is greater than 87° C., then power to the electronic system(s) is turned off 1720 to protect the electronic system(s).

FIG. 17B depicts one embodiment of a control process for backup blower control 1724, which may be implemented, for instance, by each backup blower controller of the redundant backup blower controllers. This control process includes obtaining the monitored control temperature(s) ($T_c$) 1726, and comparing the monitored control temperature(s) ($T_c$) to various set point temperatures. In a first comparison, processing determines whether the monitored control temperature(s) ($T_c$) is greater than or equal to a first, highest temperature, such as 66° C. 1728. If "yes", then the backup blowers are active and set to a highest speed, for example, 4000 RPMs 1730, after which processing waits a time interval t 1732, before again obtaining the monitored control temperature(s). Assuming that the monitored control temperature(s) ($T_c$) is less than, for instance, 66° C., then processing determines whether the monitored control temperature(s) ($T_c$) is greater than or equal to a second, lower set point temperature, such as 51° C. 1734, and if "yes", then the speed of the active backup blowers is reduced 1736, for instance, to 3500 RPMs. Thereafter, processing waits time interval t 1732, before again obtaining the monitored control temperature(s). Assuming that the monitored control temperature ($T_c$) is less than 51° C., then processing determines whether the monitored control temperature ($T_c$) is greater than or equal to a third, lower set point temperature, such as 47° C. 1738. If "yes", then the controllers set the active backup blower speeds to, for instance, 2300 RPMs, plus 300 RPMs for every 1° C. above 47° C. 1740, after which processing waits time interval t 1732 before again obtaining the monitored control temperature(s). Assuming that the monitored control temperature(s) ($T_c$) is less than 47° C., then (in this example) processing determines whether the monitored control temperature(s) ($T_c$) is below a lower cutoff temperature for operation of the backup blowers. For instance, processing determines whether the monitored control temperature ($T_c$) is less than 44° C. 1742, and if "yes", processing turns off the backup blowers 1744. Otherwise, processing returns to wait time interval t 1732 before again obtaining the monitored control temperature(s) 1726.

Figure 17C:
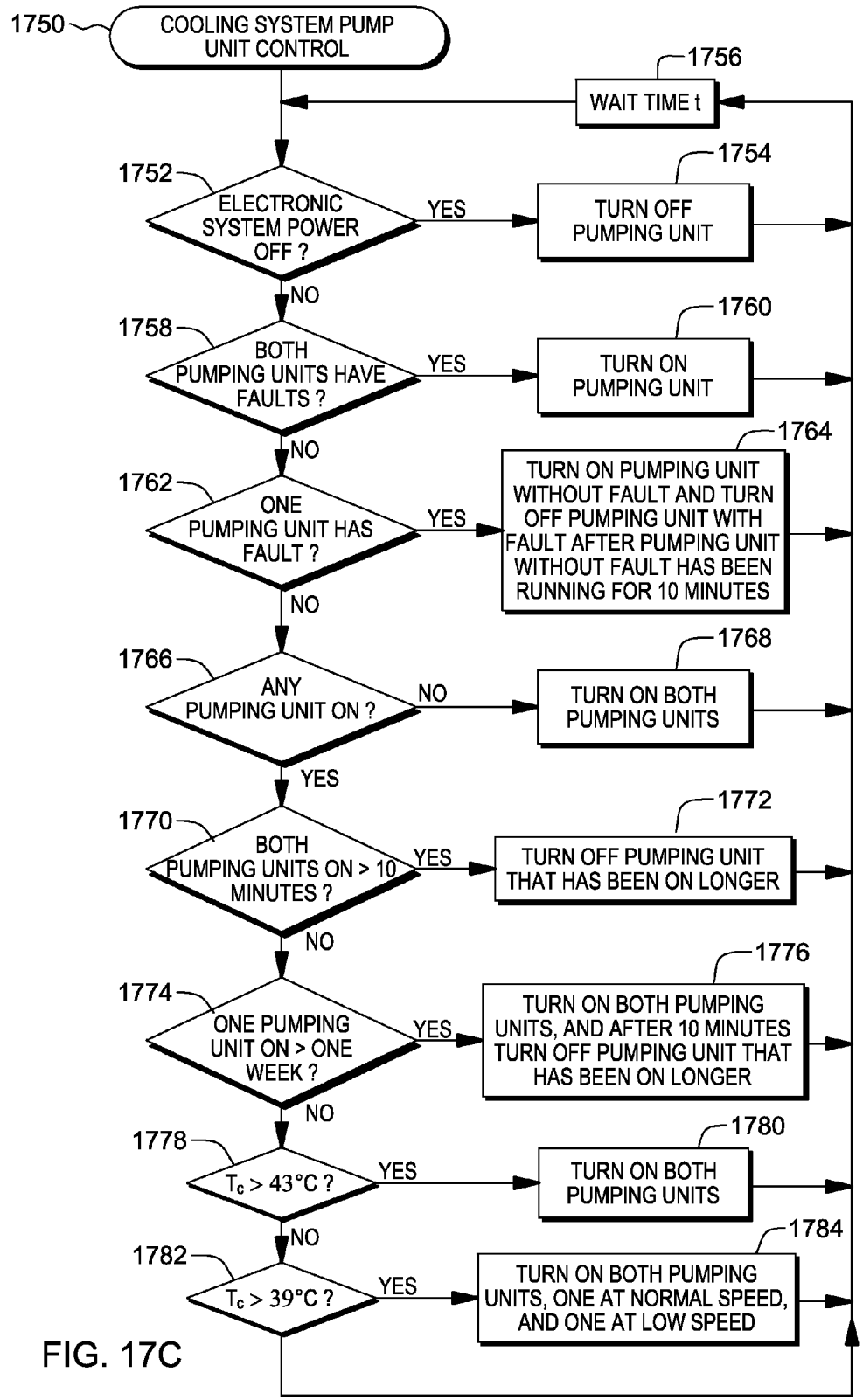
FIG. 17C depicts one embodiment of control processing implemented by, for instance, a pumping unit controller to control operation of the redundant pumping units of a multi-level redundant cooling system, such as depicted in FIG. 13, in accordance with one or more aspects of the present invention.

FIG. 17C depicts one example of cooling system pump unit control 1750, in accordance with one or more aspects of the present invention. In one example, this process control could be implemented by each pumping unit controller of the redundant pumping unit controllers of a multi-level redundant cooling system, such as described above in connection with FIG. 13. In addition to the process overview depicted in FIG. 17C, processing may turn on both pumping units if, for instance, a fill and drain tool is currently being employed to fill or drain coolant from the multi-level redundant cooling system. Note further, that the processing of FIG. 17C may be performed every few seconds, and is provided by way of example only.

Initially, processing determines whether power is off to the electronic system(s) 1752, and if "yes", turns off the pumping units 1754. Processing then waits a time interval t 1756, such as three seconds, before again evaluating the electronic system power state. Assuming that the electronic system power is on, then processing determines whether both pumping units have faults 1758, and if "yes", turns both pumping units on 1760, after which processing waits time interval t 1756 before again repeating the control loop. Assuming that both pumping units do not have faults, then processing determines whether one pumping unit has a fault 1762, and if "yes", processing turns on the pumping unit without the fault, and turns off the pumping unit with the fault, that is, after the pumping unit without the fault has been running, for instance, for ten minutes 1764. Thereafter, processing waits time interval t 1756, before again repeating the process.

Assuming that the electronic system(s) power is on, and that neither pumping unit has a fault, processing determines whether either pumping unit is on, and if "no", turns on both pumping units 1768, before again waiting time interval t 1756, and repeating the processing loop. Assuming that at least one pumping unit is on 1766, processing determines whether both pumping units have been on for greater than ten minutes 1770, and if so, turns off the pumping unit that has been on longer 1772, before waiting time interval t 1756, and repeating the process. Assuming that both pumping units have not been on for longer than ten minutes, then processing determines whether one of the pumping units has been on for greater than a set operational time interval, such as one week 1774. If "yes", then control processing turns both pumping units on, and after a period of concurrent operation (e.g, 10 minutes), turns off the pumping unit that has been on longer 1776, after which processing returns to wait time interval t 1756, and repeat the loop. Assuming that one pumping unit has not been on for more than the set operational time interval, then processing determines whether the monitored control temperature is greater than a set point temperature, such as 43° C. 1778, and if "yes" turns on both pumping units 1780 to provide additional coolant flow through the liquid-cooled portion of the multi-level redundant cooling system. Thereafter, processing returns to wait time interval t 1756, before again repeating the process.

Assuming that the monitored control temperature(s) ($T_c$) is not greater than, for instance, 43° C., then processing determines whether the monitored control temperature(s) ($T_c$) is greater than a lower set point, such as 39° C. 1782, and if so, turns on both pumping units, with one pumping unit being operated at normal speed, and the other pumping unit being operated at a lower speed, that is, a speed lower than the normal speed 1784. Thereafter, or if the monitored control temperature(s) ($T_c$) is not greater than 39° C., processing returns to wait time interval t 1756, before again repeating the process loop.

Figure 17D:
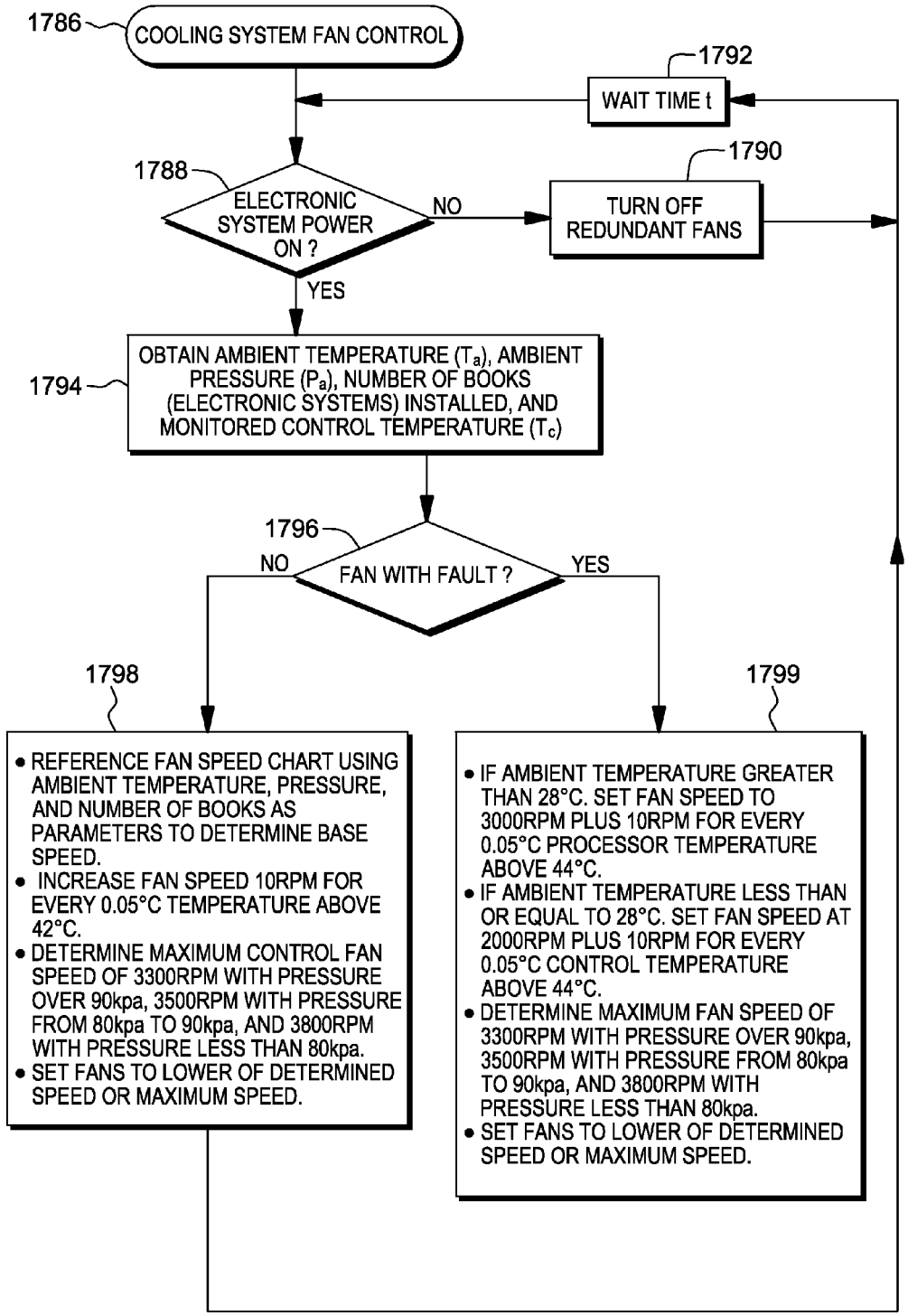
FIG. 17D depicts one embodiment of a control process implemented by, for instance, a fan controller to control operation of redundant fans associated with the coolant-based cooling apparatus of a multi-level redundant cooling system, such as depicted in FIG. 13, in accordance with one or more aspects of the present invention.

FIG. 17D depicts one example of fan controller processing 1786 implemented, for instance, by the redundant fan controllers discussed above. Initially, processing determines whether the electronic system(s) (for instance, the multichip module containing the multiple processors) is powered on 1788, and if "no", turns off the redundant fans 1790 associated with the heat exchange assembly of the coolant-cooled cooling apparatus of the cooling system 1791. Thereafter, processing waits a time interval t 1792, for instance, three seconds, before again repeating the process loop. Assuming that the electronic system(s) is powered on 1788, then processing obtains various parameters, including (for instance) ambient temperature ($T_a$), ambient pressure ($P_a$), number of processor books (e.g., number of electronic systems) installed in the cooled electronic assembly, and the monitored control temperature(s) ($T_c$). Processing then determines whether either fan of the redundant fans has a fault 1796.

If "no", then processing enters block 1798, where predetermined fan speed data, such as the monitored control temperature(s) ($T_c$) versus the fan speed chart depicted in FIG.

18, may be employed to determine a current fan speed, using (for instance) the monitored ambient temperature ($T_a$), ambient pressure ($P_a$), and number of active processor books, as variables.

Figure 18:
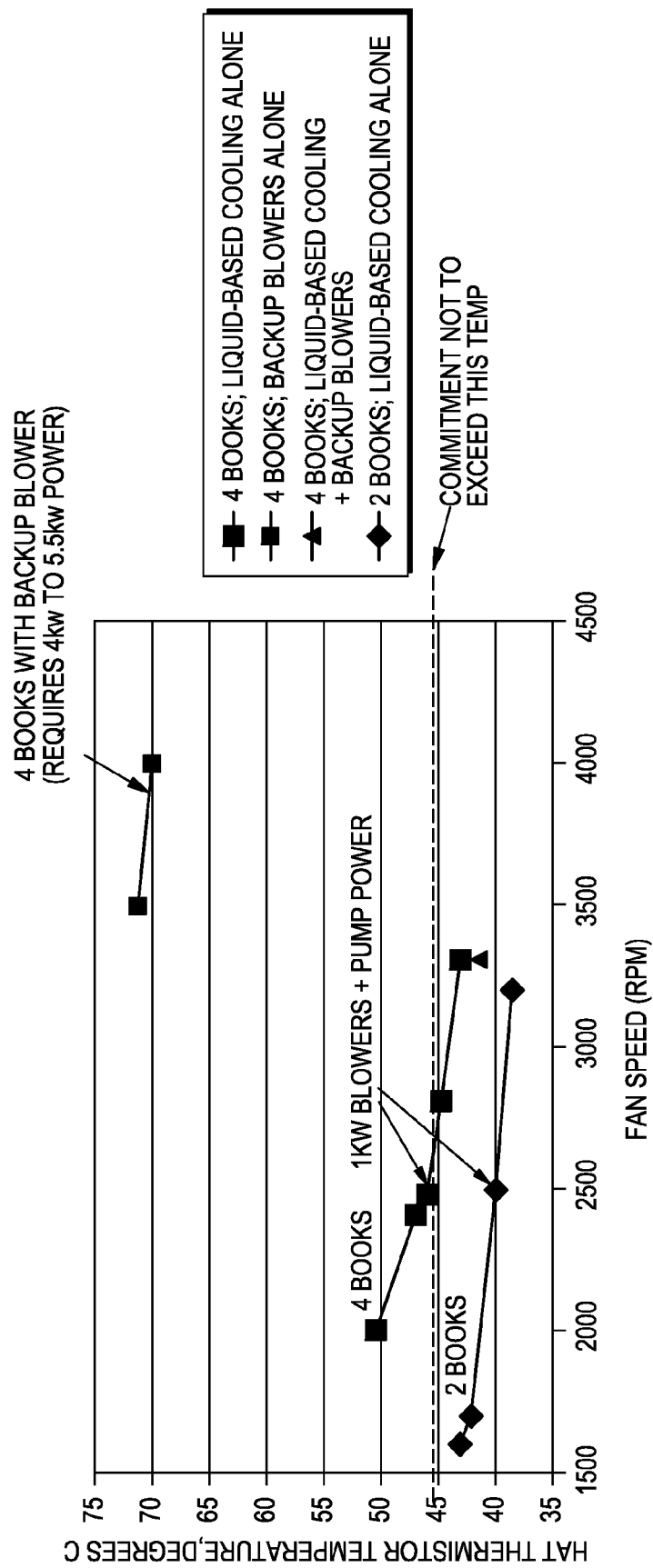
FIG. 18 depicts one embodiment of a graph of multichip module temperature versus fan speed for different combinations of electronic systems (e.g., number of processor books) and cooling approaches, in accordance with one or more aspects of the present invention.

As shown in FIG. 18, for different numbers of books (or different numbers of electronic systems) and different states of cooling system operation, that is, whether liquid-based cooling alone is employed, backup blower airflow cooling alone is employed, or both liquid-cooling and backup blower cooling are employed together, monitored control temperature ($T_c$) (such as the hat-thermistor temperature of a multichip module) can be experimentally determined as a function of fan speed associated with the one or more heat exchange assemblies. This information can then be plotted (or provided in a data structure) for access by the fan controller in a process loop, such as depicted in FIG. 17D. In the example of FIG. 18, it is assumed that the hat-thermistor temperature of the multichip module (such as depicted in FIGS. 16A & 16B) is plotted for a 2000 Watt multichip module, and assumes a 27° C. ambient temperature.

Within block 1798, the fan controller may determine a fan speed by increasing fan speed 10 RPMs for every 0.05° C. processor temperature above, for instance, 42° C. Further, processing may determine a maximum fan speed of 3300 RPMs with pressure over 90 kpa, 3500 RPMs with pressure above 80 kpa to 90 kpa, and 3800 RPMs with pressure less than 80 kpa. The fan speed may then be set to the lower of the determined speed, or the maximum speed of the fan. After adjusting fan speed in accordance with the control processes of 1798, processing returns to wait time interval t 1792 before again evaluating whether electronic system power is on 1788.

Returning to inquiry 1796, if there is a fan with a fault, then processing proceeds to block 1799, where it is determined whether the ambient temperature is greater than, for instance 28° C. If so, then fan speed may be (by way of example) determined to be 3000 RPMs, plus 10 RPMs for every 0.05° C. control temperature above 44° C. Alternatively, if the ambient temperature is less than or equal to 28° C., fan speed may be determined to be 2000 RPMs, plus 10 RPMs for every 0.05° C. control temperature above 44° C. Additionally, the controller determines a maximum fan speed of 3300 RPMs with pressure over 90 kpa, 3500 RPMs with pressure from 80 kpa to 90 kpa, and 3800 RPMs with pressure less than 80 kpa, and sets the fan to the lower of the determined speed, or the maximum speed. After setting speed of the operating fan, the controller returns to wait time interval t 1792, before again proceeding through the process loop.

Figure 19:
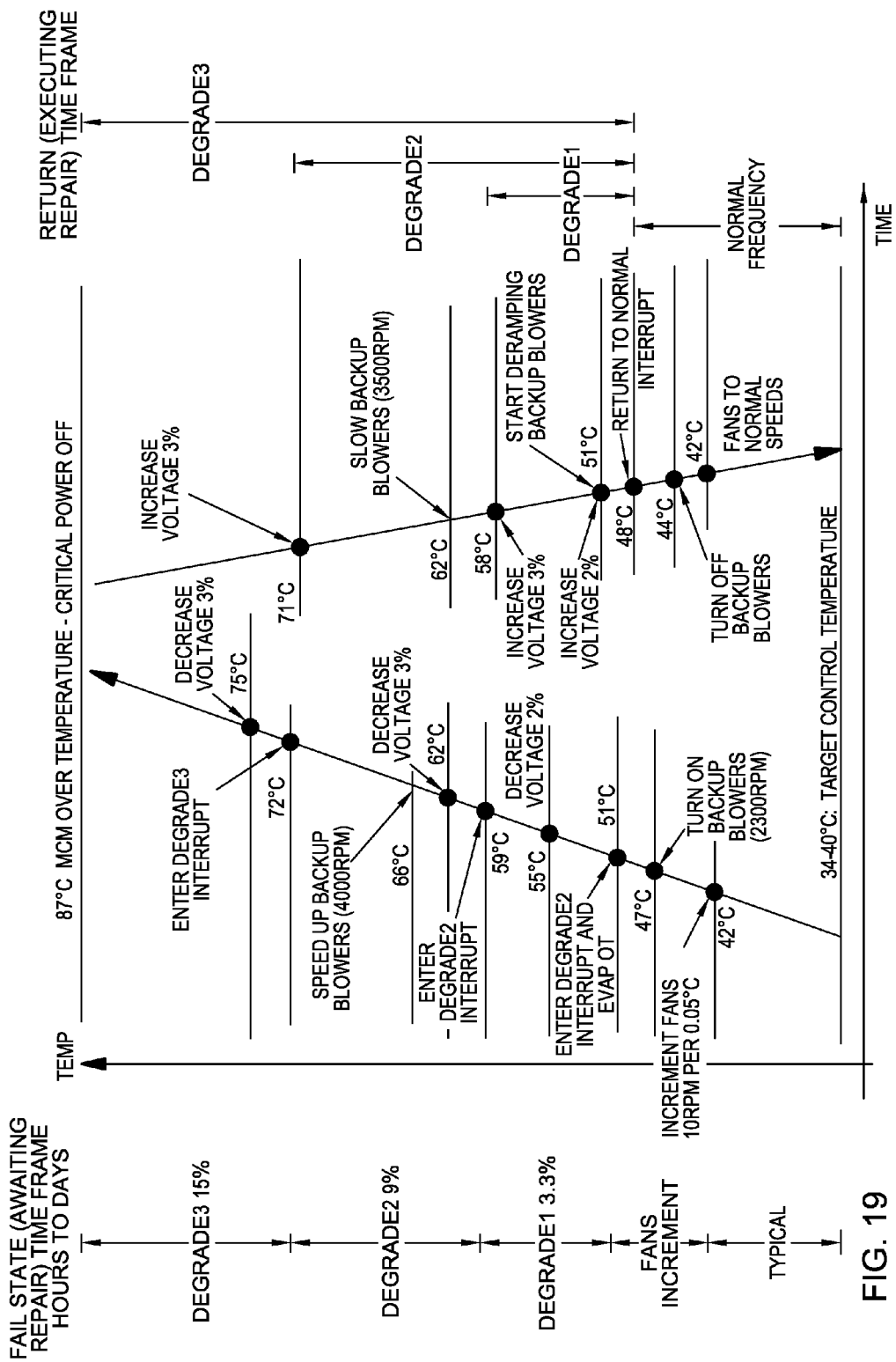
FIG. 19 depicts one detailed operational example of a cooled electronic assembly, such as depicted in FIG. 13, in accordance with one or more aspects of the present invention.

FIG. 19 depicts one detailed embodiment of processing implemented by the cooling component controllers of a multi-level redundant cooling system such as described herein. In this embodiment, the cooling component controllers and the system-level controller facilitate turning on and off the secondary coolant loop (that is, the redundant backup blowers) in concert with functioning of the primary coolant loop (that is, the coolant-based cooling apparatus), so that (for instance) a maximum or desired amount of cooling is provided to protect the electronic system's frequency and power level in any ambient, heat load, or primary coolant condition. In this example, backup blower and power system voltage and frequency controls are activated or adjusted based on, for instance, primary liquid and secondary air-coolant subsystem states. In this design, the multiple redundancy hardware components, with associated firmware (or controllers), maximizes available cooling, and hence processor frequency, and ensures no cooling outages, notwithstanding the presence of multiple concurrent failures or fault conditions within the cooling system.

In the detailed example of FIG. 19, certain of the control processes of FIGS. 17A-18 are documented in a single control flow. As described above, control actions may be determined by a highest temperature sensor reading of multiple temperature sensors employed within the one or more electronic systems to be cooled. In the lower left corner of FIG. 19, in normal operation, the temperature of the sensors associated with the electronic system(s) are all below 42° C. In this state, power and frequency to the electronic systems are at specified normal settings. Once the highest thermistor reading exceeds 42° C., the speed of the fans associated with the air-to-liquid heat exchanger is incremented by, for instance, 100 RPMs per 0.5° C. change. This incremental increasing of fan speed continues to occur until 51° C. At 47° C., the backup blowers are activated, and at 51° C., a first degrade step is entered, where frequency to the electronic system(s) is degraded by a set amount, for instance, by 3.3%. This degrade step is to implement, in one example, the above-summarized cycle steering approach.

As temperature continues to rise to, for instance, 55° C., voltage to the electronic system is decreased by 2%. Upon reaching 59° C., a second degrade step is entered, where frequency is again degraded by, for instance, 9%. A rise in temperature to 62° C. results in further decrease in voltage to the electronic systems of, approximately 3%. At 66° C., the speed of the backup blowers is increased to a maximum, for instance, 4000 RPMs. Upon reaching 72° C., a third degrade step is entered, where frequency to the electronic systems is decreased further, for instance, by 15%, and upon reaching 75° C., voltage to the electronic systems is decreased by an additional 3%. If temperature of the highest thermistor reaches 87° C., then a multichip module over-temperature condition has occurred, and the electronic systems are powered off, to await repair of the cooling system. Note that the system may remain in one or more of the degrade states for a period of hours, or days, depending upon the fault or environmental condition causing the over-temperature reading.

Upon executing repair to the cooling system, cooling system operation may return, following the right branch of the plot, from an over-temperature condition down to, for instance 71° C., where voltage or power supply to the electronic systems is increased by 3%, and frequency may be increased to degrade step 2. Upon reaching 62° C., the backup blowers may be slowed to, for instance, 3500 RPMs, and upon reaching 58° C., power to the electronic systems may be increased by an additional 3%, and frequency may be increased to degrade step 1 from degrade step 2. Upon reaching 51° C., the backup blowers may be deactivated, and power to the electronic circuits increased by an additional 2%. Once all temperature thermistor readings are at or below 48° C., then the system is returned to normal in terms of frequency and voltage applied. At 44° C., the backup blowers are turned off, and at 42° C. and below, fan speed of the fans providing the airflow across the one or more heat exchange assemblies is reduced to a specified normal speed.

Note that in the above example, there is no cycle time hysteresis. The cycle time will only return to normal. Voltage change hysteresis may be approximately 40° C., and backup blower speed change hysteresis is assumed to be "none" when incrementing. The maximum degrade mode reached during a failure scenario will remain in effect until a successful repair returns temperature and voltage to normal.

Those skilled in the art will note from the above description that the multi-level redundant cooling systems disclosed herein provide sufficient redundancy for all mechanical moving components of the cooling system, including electronic drive cards and sensors to be concurrently replaceable.

Backup blowers and associated drive cards are also concurrently replaceable. The backup blowers provide backup (or auxiliary) air-cooling of the one or more electronic systems to be cooled, for instance, in the case of a degraded performance of the primary, liquid-based cooling apparatus. The separate backup blowers may provide an auxiliary air-cooling to be used either alone, for instance, at below full-frequency processor speeds, for (for example) servicing of the coolant-based cooling apparatus in a situation requiring complete shut-down of the coolant-based cooling apparatus. In this manner, even leaks to the plumbing hardware may be serviced without shut-down of the electronic systems or the cooling system cooling the electronic systems. Additionally, the backup blowers may be used in conjunction with a partial degrade of the primary cooling system, such as in the case of a failed fan in the primary cooling circuit, which allows full-frequency operation of the electronic systems to proceed. Still further, the separate, redundant backup blowers may be employed to direct airflow across the electronic systems to enhance cooling of, for instance, a processor, and thus operation of the processor at a specified full-frequency, even in the case where an application program consumes more power than the system is rated for. Still further, the backup blowers provide enhanced cooling of the electronic system(s), allowing the system to continue operating at full frequency, even in the case where the ambient conditions the electronic system is functioning in are outside of a specified envelope, for instance, may have a higher ambient temperature, or lower atmospheric pressure, than the system was normally intended to support.

As a specific advantage, the multichip module-level heat sink disclosed herein provides multiple parallel paths for heat removal, that is, through coolant flowing through the liquid-cooled cold plates, and the airflow passing across a plurality of air-cooled heat sink fins. The sensed parameters may comprise one or more monitored control temperatures, such as hat-thermistor temperatures associated with one or more multichip modules or processor books of one or more electronic systems.

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 20:
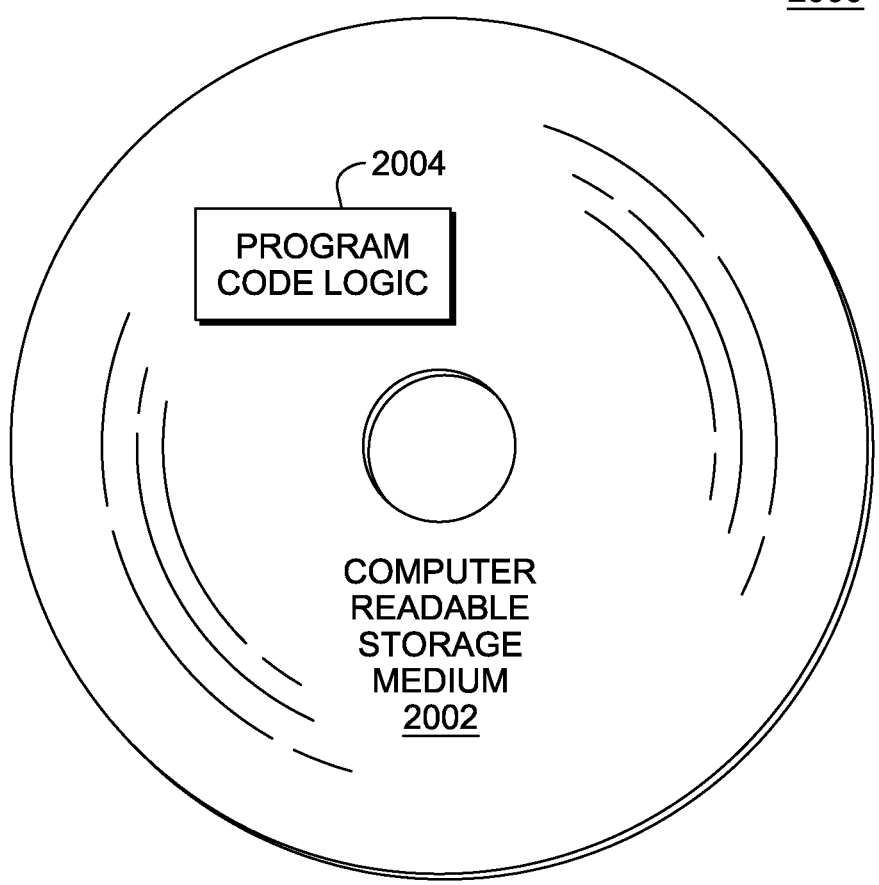
FIG. 20 depicts one embodiment of a computer program product incorporating one or more aspects of the present invention.

Referring to FIG. 20, in one example, a computer program product 2000 includes, for instance, one or more non-transitory computer readable storage media 2002 to store computer readable program code means or logic 2004 thereon to provide and facilitate one or more aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more control aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more control aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more control aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more control aspects of the present invention. As one example, the deploying of an application comprises providing computer infrastructure operable to perform one or more control aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more control aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling system comprising:
   a coolant-based cooling apparatus configured to assist in removal of heat generated by one or more electronic systems of an electronic rack, the coolant-based cooling apparatus being disposed within the electronics rack and comprising at least one heat exchange assembly to discharge heat from coolant of the coolant-based cooling apparatus to an ambient airflow passing across the at least one heat exchange assembly, the ambient airflow discharging from the electronics rack in a first region of an air exhaust side of the electronics rack;
   redundant pumping units to facilitate pumping of the coolant through the coolant-based cooling apparatus and thereby assist in removal of heat generated by the one or more electronic systems, and discharge of the heat via the at least one heat exchange assembly, wherein the redundant pumping units are coupled to the coolant-based cooling apparatus in parallel fluid communication to separately provide pumping of the coolant through the coolant-based cooling apparatus;
   at least one primary air-moving device to provide a primary airflow across the one or more electronic systems to cool the one or more electronic systems, the coolant-based cooling apparatus assisting in cooling the one or more electronic systems in combination with the primary airflow provided by the at least one primary air-moving device, the primary airflow being distinct from the ambient airflow across the at least one heat exchange assembly of the coolant-based cooling apparatus, and the primary airflow discharging from the electronics rack in a second region of the air exhaust side of the electronics rack, the second region being different from the first region;

redundant auxiliary blowers to provide, when active, an auxiliary airflow across the one or more electronic systems to provide, at least in part, auxiliary airflow cooling thereof, the redundant auxiliary blowers being distinct from the at least one primary moving device, and the auxiliary airflow provided by the redundant auxiliary blowers passing differently across the one or more electronic systems than the primary airflow provided by the at least one primary air-moving device, and the auxiliary airflow discharging from the electronics rack in a third region of the air exhaust side of the electronics rack, the third region being different from the first region and the second region; and multiple separate controllers, the multiple separate controllers controlling operation of the redundant pumping units and the redundant auxiliary blowers based, at least in part, on one or more sensed parameters, wherein at least one controller of the multiple separate controllers activates the redundant auxiliary blowers responsive to the one or more sensed parameters exceeding a set threshold, the redundant auxiliary blowers being controllable to provide, at least in part, the auxiliary airflow cooling to the one or more electronic systems in combination with cooling by the coolant-based cooling apparatus and the primary airflow.

2. The cooling system of claim 1, wherein the multiple separate controllers comprise redundant pumping unit controllers, each pumping unit controller of the redundant pumping, unit controllers being associated with and controlling operation of a respective pumping unit of the redundant pumping units, and wherein the multiple separate controllers further comprise redundant auxiliary blower controllers, each auxiliary blower controller of the redundant auxiliary blower controllers being associated with and controlling operation of a respective auxiliary blower of the redundant auxiliary blowers, and wherein the cooling system remains operational, notwithstanding failure of any two of the redundant pumping units, the redundant pumping unit controllers, the redundant auxiliary blowers, and the redundant auxiliary blower controllers.

3. The cooling system of claim 1, wherein the redundant auxiliary blowers are disposed above the one or more electronic systems, and wherein the cooling system further comprises auxiliary airflow ducting which facilitates directing the auxiliary airflow across the one or more electronic systems when the redundant auxiliary blowers are active.

4. The cooling system of claim 1, wherein the multiple separate controllers comprise at least one pumping unit controller controlling operation of the redundant pumping units, at least one auxiliary blower controller controlling operation of the redundant auxiliary blowers, and at least one power supply controller controlling operation of redundant power supplies powering the one or more electronic systems, wherein the at least one pumping unit controller, the at least one auxiliary blower controller, and the at least one power supply controller operate independently to respectively control operation of the redundant pumping units, the redundant auxiliary blowers, and the redundant power supplies.

5. The cooling system of claim 4, further comprising redundant fans disposed to provide an airflow across the at least one heat exchange assembly, and wherein the multiple separate controllers comprise at least one fan controller controlling operation of the redundant fans, the at least one fan controller operating independently of the at least one pumping unit controller, the at least one auxiliary blower controller, and the at least one power supply controller to control operation of the redundant fans.

6. The cooling system of claim 4, wherein the multiple separate controllers comprise redundant pumping unit controllers, redundant auxiliary blower controllers, and redundant power supply controllers, each controller of the redundant pumping unit controllers, auxiliary blower controllers, and power supply controllers, operating independently to control operation of its respective pumping unit, auxiliary blower, or power supply.

7. The cooling system of claim 1, further comprising at least one power supply providing power to the one or more electronic systems, and wherein the multiple separate controllers comprise at least one power supply controller, the at least one power supply controller facilitating, powering, via the at least one power supply, the one or more electronic systems at a specified frequency and voltage when a control temperature is below a lower temperature threshold, and turning off the at least one power supply when the control temperature exceeds an upper temperature threshold, the control temperature being one sensed parameter of the one or more sensed parameters, and the at least one power supply controller further degrading, at least in part, frequency and voltage of power supplied by the at least one power supply to the one or more electronic systems with progression of the control temperature from the lower temperature threshold to the upper temperature threshold.

8. The cooling system of claim 1, wherein the one or more sensed parameters comprise at least one monitored control temperature, and wherein the multiple separate controllers comprise at least one auxiliary blower controller controlling operation of the redundant auxiliary blowers, the at least one auxiliary blower controller automatically adjusting speed of the redundant auxiliary blowers with temperature changes to the at least one monitored control temperature above a lower temperature threshold, and below the lower temperature threshold, the at least one auxiliary blower controller automatically turning off the redundant auxiliary blowers.

9. The cooling system of claim 1, wherein the one or more sensed parameters comprise at least one monitored control temperature, and wherein the multiple separate controllers comprise at least one pumping unit controller, the at least one pumping unit controller automatically switching pumping operation between the redundant pumping units responsive to detection of a fault in one pumping unit of the redundant pumping units, the automatically switching operation comprising operating the redundant pumping units in parallel for a period of time, and subsequent to the period of time, deactivating the one pumping unit of the redundant pumping units with the detected fault.

10. The cooling system of claim 1, wherein the one or more sensed parameters comprise at least one monitored control temperature, and wherein the multiple separate controllers comprise at least one pumping unit controller, the at least one pumping unit controller automatically operating the redundant pumping units responsive to the at least one monitored control temperature exceeding a first threshold temperature, with one pumping unit of the redundant pumping units being operated at a specified normal speed, and another pumping unit of the redundant pumping units being operated at a lower speed, lower than the specified normal speed.

11. The cooling system of claim 10, wherein the at least one pumping unit controller operates the one pumping unit at the specified normal speed, and the another pumping unit of the redundant pumping units at the specified normal speed when the at least one monitored control temperature exceeds a second temperature threshold, wherein the second temperature threshold is greater than the first temperature threshold.

12. The cooling system of claim 1, further comprising redundant fans associated with the coolant-based cooling apparatus and facilitating providing an airflow across the at least one heat exchange assembly to assist in discharge of heat from coolant of the coolant-based cooling apparatus to the airflow passing across the at least one heat exchange assembly, and the multiple separate controllers comprising at least one fan controller controlling operation of the redundant fans providing the airflow across the at least one heat exchange assembly, the at least one fan facilitating controller automatically adjusting operational speed of the redundant fans with changes in ambient air temperature.

13. The cooling system of claim 12, wherein the at least one fan controller automatically determines an operational speed for at least one fan of the redundant fans based, at least in part, on ambient temperature and pressure.

14. A cooled electronic assembly comprising:
an electronics rack, the electronics rack comprising one or more electronic systems; and
a cooling system for cooling the one or more electronic systems, the cooling system comprising:
  a coolant-based cooling apparatus configured to assist in removal of heat generated by one or more electronic systems, the coolant-based cooling apparatus being disposed within the electronics rack and comprising at least one heat exchange assembly to discharge heat from coolant of the coolant-based cooling apparatus to an ambient airflow passing across the at least one heat exchange assembly, the ambient airflow discharging from the electronics rack in a first region of an air exhaust side of the electronics rack;
  redundant pumping units to facilitate pumping of the coolant through the coolant-based cooling apparatus and thereby assist in removal of heat generated by the one or more electronic systems, and discharge of the heat via the at least one heat exchange assembly, wherein the redundant pumping units are coupled to the coolant-based cooling apparatus in parallel fluid communication to separately provide pumping of the coolant through the coolant-based cooling apparatus;
  at least one primary air-moving device to provide a primary airflow across the one or more electronic systems to cool the one or more electronic systems, the coolant-based cooling apparatus assisting in cooling the one or more electronic systems in combination with the primary airflow provided by the primary air-moving device, the primary airflow being distinct from the ambient airflow across the at least one heat exchange assembly of the coolant-based cooling apparatus, and the primary airflow discharging from the electronics rack in a second region of the air exhaust side of the electronics rack, the second region being different from the first region;
  redundant auxiliary blowers to provide, when active, an auxiliary airflow across the one or more electronic systems to provide, at least in part, auxiliary airflow cooling thereof, the redundant auxiliary blowers being distinct from the at least one primary air-moving device, and the auxiliary airflow provided by the redundant auxiliary blowers passing differently across the one or more electronic systems than the primary airflow provided by the at least one primary air-moving device, and the auxiliary airflow discharging from the electronics rack in a third region of the air exhaust side of the electronics rack, the third region being different from the first region and the second region; and
  multiple separate controllers, the multiple separate controllers controlling operation of the redundant pumping units and the redundant auxiliary blowers based, at least in part, on one or more sensed parameters, wherein at least one controller of the multiple separate controllers activates the redundant auxiliary blowers responsive to the one or more sensed parameters exceeding a set threshold, the redundant auxiliary blowers being controllable to provide, at least in part, the auxiliary airflow cooling to the one or ore electronic systems in combination with cooling by the coolant-based cooling apparatus and the primary airflow.

15. The cooled electronic assembly of claim 14, wherein the coolant-based cooling apparatus and the redundant pumping units are disposed within the electronics rack below the one or more electronic systems, and wherein the redundant auxiliary blowers are disposed within the electronics rack above the one or more electronic systems, and the cooling system further comprises auxiliary airflow ducting which facilitates directing the auxiliary airflow across the one or more electronic systems when the redundant auxiliary blowers are active.

16. The cooled electronic assembly of claim 15, wherein the one or more electronic systems comprises one or more multichip modules, and wherein the coolant-based cooling apparatus further comprises one or more coolant-cooled cold plates coupled in thermal communication via one or more heat spreaders with the one or more multichip modules, and wherein one coolant-cooled cold plate of the one or more coolant-cooled cold plates comprises a plurality of air-cooled fins extending from a main surface thereof, the plurality of air-cooled fins facilitating auxiliary airflow cooling of the one or more multichip modules when the redundant auxiliary blowers are active.

17. The cooled electronic assembly of claim 15, wherein the auxiliary-airflow cooling is provided concurrent with the primary airflow cooling provided by the at least one primary air-moving device.

18. The cooled electronic assembly of claim 4, wherein the multiple separate controllers comprise redundant pumping unit controllers, each pumping unit controller of the redundant pumping unit controllers being associated with and controlling operation of a respective pumping unit of the redundant pumping units, and wherein the multiple separate controllers further comprise redundant auxiliary blower controllers, each auxiliary blower controller of the redundant auxiliary blower controllers being associated with and controlling operation of a respective auxiliary blower of the redundant auxiliary blowers, and wherein the cooling system remains operational, notwithstanding failure of any two of the redundant pumping units, the redundant pumping unit controllers, the redundant auxiliary blowers, and the redundant auxiliary blower controllers.

19. The cooled electronic assembly of claim 14, wherein the multiple separate controllers comprise at least one pumping unit controller controlling operation of the redundant pumping units, at least one auxiliary blower controller controlling operation of the redundant auxiliary blowers, at least one power supply controller controlling operation of redundant power supplies powering the one or more electronic systems, and at least one fan controller controlling operation of redundant fans providing an airflow across the at, least one heat exchange assembly, wherein the at least one pumping unit controller, the at least one auxiliary blower controller, the at least one power supply controller, and the at least one fan controller operate independently to respectively control operation of the redundant pumping units, the redundant auxiliary blowers, the redundant power supplies, and the redundant fans.

* * * * *